United States Patent
Rathburn

(10) Patent No.: US 10,159,154 B2
(45) Date of Patent: Dec. 18, 2018

(54) FUSION BONDED LIQUID CRYSTAL POLYMER CIRCUIT STRUCTURE

(71) Applicant: HSIO TECHNOLOGIES, LLC, Maple Grove, MN (US)

(72) Inventor: James Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 456 days.

(21) Appl. No.: 14/864,215

(22) Filed: Sep. 24, 2015

(65) Prior Publication Data

US 2016/0014908 A1    Jan. 14, 2016

Related U.S. Application Data

(63) Continuation-in-part of application No. 14/408,205, filed as application No. PCT/US2013/030856 on
(Continued)

(51) Int. Cl.
*H05K 3/46* (2006.01)
*C25D 7/12* (2006.01)
(Continued)

(52) U.S. Cl.
CPC ....... *H05K 3/4623* (2013.01); *C23C 18/1653* (2013.01); *C23C 18/1689* (2013.01);
(Continued)

(58) Field of Classification Search
CPC .. H05K 3/4623; H05K 3/4635; H05K 3/4679; B23K 26/382; B23K 1/00;
(Continued)

(56) References Cited

U.S. PATENT DOCUMENTS

| 3,672,986 A | 6/1972 | Schneble, Jr. et al. |
| 4,188,438 A | 2/1980 | Burns |

(Continued)

FOREIGN PATENT DOCUMENTS

| JP | 2003/217774 | 7/2003 |
| JP | 3274601 | 3/2009 |

(Continued)

OTHER PUBLICATIONS

Notification of Transmittal of the International Search Report and the Written Opinion of the International Searching Authority dated Jul. 30, 2010 in International Application No. PCT/US2010/036043.

(Continued)

*Primary Examiner* — Peter DungBa Vo
*Assistant Examiner* — Azm Parvez

(57) ABSTRACT

A method of making a multilayered, fusion bonded circuit structure. A first circuitry layer is attached to a first major surface of a first LCP substrate. A plurality of first recesses are formed that extend from a second major surface of the first substrate to the first circuitry layer. The first recesses are then plated to form a plurality of first conductive pillars of solid metal that substantially fill the first recesses. A plurality of second recesses are formed in a second LCP substrate corresponding to a plurality of the first conductive pillars. The second recess are plated to form a plurality of second conductive structures that extend between first and second major surfaces of the second substrate. The second major surface of the first substrate is positioned adjacent to the second major surface of the second substrate. The first conductive pillars are aligned with the second conductive structures. The stack is then fusion bonded to mechanically couple the first conductive pillars to the second conductive structures.

18 Claims, 20 Drawing Sheets

Related U.S. Application Data

Mar. 13, 2013, now Pat. No. 9,699,906, which is a continuation-in-part of application No. 14/408,039, filed as application No. PCT/US2013/030981 on Mar. 13, 2013, now Pat. No. 9,350,124, application No. 14/864,215, which is a continuation-in-part of application No. PCT/US2014/045856, filed on Jul. 9, 2014, and a continuation-in-part of application No. 14/238,638, filed as application No. PCT/US2012/053848 on Sep. 6, 2012, now Pat. No. 9,603,249, application No. 14/864,215, which is a continuation-in-part of application No. 13/700,639, filed as application No. PCT/US2011/038845 on Jun. 2, 2011, now Pat. No. 9,184,527.

(60) Provisional application No. 61/915,194, filed on Dec. 12, 2013, provisional application No. 61/845,088, filed on Jul. 11, 2013, provisional application No. 61/669,884, filed on Jul. 10, 2012, provisional application No. 61/669,893, filed on Jul. 10, 2012, provisional application No. 61/532,379, filed on Sep. 8, 2011, provisional application No. 61/351,114, filed on Jun. 3, 2010.

(51) Int. Cl.

| | |
|---|---|
| *H05K 1/03* | (2006.01) |
| *C25D 5/02* | (2006.01) |
| *C23C 18/16* | (2006.01) |
| *H05K 3/42* | (2006.01) |
| *B23K 103/12* | (2006.01) |
| *B23K 103/00* | (2006.01) |
| *C23C 18/38* | (2006.01) |

(52) U.S. Cl.
CPC .............. *C25D 5/022* (2013.01); *C25D 7/123* (2013.01); *H05K 1/0393* (2013.01); *H05K 3/4635* (2013.01); *H05K 3/4679* (2013.01); *B23K 2103/12* (2018.08); *B23K 2103/30* (2018.08); *C23C 18/38* (2013.01); *H01L 2224/16225* (2013.01); *H01L 2224/48091* (2013.01); *H01L 2224/48227* (2013.01); *H01L 2924/15311* (2013.01); *H05K 3/421* (2013.01); *H05K 3/429* (2013.01); *H05K 2201/0141* (2013.01); *H05K 2201/09563* (2013.01); *Y10T 29/49002* (2015.01)

(58) Field of Classification Search
CPC ................ B23K 1/19; Y10T 29/49002; Y10T 29/49117; Y10T 29/49124; Y10T 29/49126
USPC ....... 830/830, 829, 832, 825, 592.1; 29/830, 29/829, 832, 825, 592.1
See application file for complete search history.

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,046,238 A | 9/1991 | Daigle |
| 5,071,363 A | 12/1991 | Reylek et al. |
| 5,072,520 A | 12/1991 | Nelson |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,534,787 A | 7/1996 | Levy |
| 5,562,462 A | 10/1996 | Matsuba et al. |
| 5,596,178 A | 1/1997 | Christian |
| 5,619,018 A | 4/1997 | Rossi |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,880,590 A | 3/1999 | Desai et al. |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,433,427 B1 | 8/2002 | Wu et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |

(56) References Cited

U.S. PATENT DOCUMENTS

| | | |
|---|---|---|
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,765,288 B2 | 7/2004 | Damberg |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhasu et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,049,838 B2 | 5/2006 | Kagami |
| 7,064,412 B2 | 6/2006 | Geissinger et al. |
| 7,070,419 B2 | 7/2006 | Brown et al. |
| 7,095,090 B2 | 8/2006 | Nakajiman et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,535,114 B2 | 5/2009 | Agraharam et al. |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,004,092 B2 | 8/2011 | Lin |
| 8,044,502 B2 | 10/2011 | Rathburn |
| 8,058,558 B2 | 11/2011 | Mok et al. |
| 8,072,058 B2 | 12/2011 | Kim et al. |
| 8,120,173 B2 | 2/2012 | Forman et al. |
| 8,144,687 B2 | 2/2012 | Mizoguchi |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakagushi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,911,266 B2 | 12/2014 | Kawate |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |

(56) References Cited

U.S. PATENT DOCUMENTS

| | | |
|---|---|---|
| 8,988,093 B2 | 3/2015 | Rathburn |
| 9,093,767 B2 | 7/2015 | Rathburn |
| 9,136,196 B2 | 9/2015 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akrma et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2002/0179334 A1 | 12/2002 | Curcio |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0141684 A1 | 7/2003 | Maruyama et al. |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0063312 A1* | 3/2006 | Kurita ............... H01L 21/563 438/127 |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0265919 A1 | 10/2006 | Huang |
| 2006/0258912 A1 | 11/2006 | Belson et al. |
| 2006/0261827 A1 | 11/2006 | Cooper et al. |
| 2006/0274510 A1 | 12/2006 | Nakada |
| 2006/0281303 A1 | 12/2006 | Trezza et al. |
| 2007/0021002 A1 | 1/2007 | Laurx et al. |
| 2007/0035030 A1 | 2/2007 | Horton |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1* | 9/2007 | Das ................ H05K 3/4623 174/264 |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1* | 11/2007 | White ............... H01F 41/041 156/290 |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0117606 A1 | 5/2008 | Karlsson |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0233672 A1* | 9/2008 | Heck ................ B82Y 10/00 438/48 |
| 2008/0237884 A1 | 10/2008 | Hsu |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0047808 A1 | 2/2009 | Ma |
| 2009/0058444 A1 | 3/2009 | McIntyre |
| 2009/0061089 A1 | 3/2009 | King |
| 2009/0071699 A1 | 3/2009 | Hsu |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0309212 A1* | 12/2009 | Shim, II ........... H01L 21/568 257/700 |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |

(56) References Cited

U.S. PATENT DOCUMENTS

| | | |
|---|---|---|
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0045350 A1 | 2/2014 | Taylor |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0009644 A1 | 1/2015 | Rendek |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181810 A1 | 6/2015 | Rathburn |

FOREIGN PATENT DOCUMENTS

| | | |
|---|---|---|
| WO | WO 1991/014015 | 9/1991 |
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO 2015/006393 | 1/2015 |

OTHER PUBLICATIONS

Notification of Transmittal of the International Search Report and the Written Opinion of the International Searching Authority dated Jul. 21, 2010 in International Application No. PCT/US2010/036047.

Notification of Transmittal of the International Search Report and the Written Opinion of the International Searching Authority dated Jul. 28, 2010 in International Application No. PCT/US2010/036363.

Notification of Transmittal of the International Search Report and the Written Opinion of the International Searching Authority dated Jul. 28, 2010 in International Application No. PCT/US2010/036377.

Notification of Transmittal of the International Search Report and the Written Opinion of the International Searching Authority dated Jul. 30, 2010 in International Application No. PCT/US2010/036388.

Notification of Transmittal of the International Search Report and the Written Opinion of the International Searching Authority dated Jul. 27, 2010 in International Application No. PCT/US2010/036397.

Notification of Transmittal of the International Search Report and the Written Opinion of the International Searching Authority dated Jul. 30, 2010 in International Application No. PCT/US2010/036055.

Notification of Transmittal of the International Search Report and the Written Opinion of the International Searching Authority dated Aug. 4, 2010 in International Application No. PCT/US2010/036288.

Notification of Transmittal of the International Search Report and the Written Opinion of the International Searching Authority dated Aug. 4, 2010 in International Application No. PCT/US2010/036285.

Notification of Transmittal of the International Search Report and the Written Opinion of the International Searching Authority dated Jul. 30, 2010 in International Application No. PCT/US2010/036282.

Notification of Transmittal of the International Search Report and the Written Opinion of the International Searching Authority dated Jul. 30, 2010 in International Application No. PCT/US2010/036295.

Notification of Transmittal of the International Search Report and the Written Opinion of the International Searching Authority dated Jul. 30, 2010 in International Application No. PCT/US2010/036313.

Notification of Transmittal of the International Search Report and the Written Opinion of the International Searching Authority dated Aug. 3, 2010 in International Application No. PCT/US2010/037619.

Notification of Transmittal of the International Search Report and the Written Opinion of the International Searching Authority dated Sep. 7, 2010 in International Application No. PCT/US2010/038600.

Notification of Transmittal of the International Search Report and the Written Opinion of the International Searching Authority dated Aug. 18, 2010 in International Application No. PCT/US2010/038606.

Notification of Transmittal of the International Search Report and the Written Opinion of the International Searching Authority dated Sep. 1, 2010 in International Application No. PCT/US2010/040188.

Notification of Transmittal of the International Search Report and the Written Opinion of the International Searching Authority dated Aug. 20, 2010 in International Application No. PCT/US2010/040197.

Notification of Transmittal of the International Search Report and the Written Opinion of the International Searching Authority dated Apr. 14, 2011 in International Application No. PCT/US2011/023138.

Notification of Transmittal of the International Search Report and the Written Opinion of the International Searching Authority dated Aug. 17, 2011 in International Application No. PCT/US2011/033726.

Notification of Transmittal of the International Search Report and the Written Opinion of the International Searching Authority dated Sep. 27, 2011 in International Application No. PCT/US2011/038845.

(56) References Cited

OTHER PUBLICATIONS

Notification of Transmittal of the International Search Report and the Written Opinion of the International Searching Authority dated Feb. 8, 2012 in International Application No. PCT/US2011/056664.
Notification of Transmittal of the International Search Report and the Written Opinion of the International Searching Authority dated Mar. 26, 2012 in International Application No. PCT/US2011/062313.
Notification of Transmittal of the International Search Report and the Written Opinion of the International Searching Authority dated Jun. 20, 2012 in International Application No. PCT/US2012/027813.
Restriction Requirement dated Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement dated Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action dated Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended dated Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Final Office Action dated May 15, 2014 in co-pending U.S. Appl. No. 13/266,486, now published as US Patent Application Publication No. US 2012/0055701.
Amendment and Response Under Rule 1.116 filed Jul. 10, 2014 in co-pending U.S. Appl. No. 13/266,486, now published as US Patent Application Publication No. US 2012/0055701.
Advisory Action dated Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment dated Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Notice of Allowance and Fee(s) Due dated Nov. 24, 2014 in co-pending U.S. Appl. No. 13/266,486, now published as US Patent Application Publication No. US 2012/0055701.
Supplemental Notice of Allowance dated Dec. 24, 2014 in co-pending U.S. Appl. No. 13/266,486, now published as US Patent Application Publication No. US 2012/0055701.
Notice of Allowance and Fee(s) Due dated May 2, 2014 in co-pending U.S. Appl. No. 13/266,522, now U.S. Pat. No. 8,803,539.
Restriction Requirement dated Oct. 1, 2013 in co-pending U.S. Appl. No. 13/319,145, now U.S. Pat. No. 8,970,031.
Response to Restriction Requirement filed Oct. 4, 2013 in co-pending U.S. Appl. No. 13/319,145, now U.S. Pat. No. 8,970,031.
Office Action dated Dec. 26, 2013 in co-pending U.S. Appl. No. 13/319,145, now U.S. Pat. No. 8,970,031.
Amendment and Response filed Mar. 18, 2014 in co-pending U.S. Appl. No. 13/319,145, now U.S. Pat. No. 8,970,031.
Final Office Action dated Aug. 4, 2014 in co-pending U.S. Appl. No. 13/319,145, now U.S. Pat. No. 8,970,031.
Applicant-Initiated Interview Summary dated Sep. 12, 2014 in co-pending U.S. Appl. No. 13/319,145, now U.S. Pat. No. 8,970,031.
Amendment and Response Under Rule 1.116 filed Sep. 18, 2014 in co-pending U.S. Appl. No. 13/319,145, now U.S. Pat. No. 8,970,031.
Notice of Allowance and Fee(s) Due dated Dec. 19, 2014 in co-pending U.S. Appl. No. 13/319,145, now U.S. Pat. No. 8,970,031.
Office Action dated Nov. 22, 2013 in co-pending U.S. Appl. No. 13/266,907, now U.S. Pat. No. 8,928,344.
Amendment and Response filed Jan. 3, 2014 in co-pending U.S. Appl. No. 13/266,907, now U.S. Pat. No. 8,928,344.
Supplemental Amendment and Response filed Jan. 29, 2014 in co-pending U.S. Appl. No. 13/266,907, now U.S. Pat. No. 8,928,344.
Final Office Action dated May 7, 2014 in co-pending U.S. Appl. No. 13/266,907, now U.S. Pat. No. 8,928,344.
Amendment and Response Under Rule 1.116 dated Jul. 10, 2014 in co-pending U.S. Appl. No. 13/266,907, now U.S. Pat. No. 8,928,344.
Advisory Action dated Jul. 25, 2014 in co-pending U.S. Appl. No. 13/266,907, now U.S. Pat. No. 8,928,344.
Advisory Action dated Aug. 8, 2014 in co-pending U.S. Appl. No. 13/266,907, now U.S. Pat. No. 8,928,344.
Amendment and Response to Final Office Action and RCE filed Aug. 26, 2014 in co-pending U.S. Appl. No. 13/266,907, now U.S. Pat. No. 8,928,344.
Notice of Allowance and Fee(s) Due dated Oct. 8, 2014 in co-pending U.S. Appl. No. 13/266,907, now U.S. Pat. No. 8,928,344.
Office Action dated Jan. 3, 2014 in co-pending U.S. Appl. No. 13/318,038, now U.S. Pat. No. 8,912,812.
Amendment and Response and Terminal Disclaimer filed Apr. 2, 2014 in co-pending U.S. Appl. No. 13/318,038, now U.S. Pat. No. 8,912,812.
Terminal Disclaimer Review Decision dated Apr. 2, 2014 in co-pending U.S. Appl. No. 13/318,038, now U.S. Pat. No. 8,912,812.
Final Office Action dated Aug. 1, 2014 in co-pending U.S. Appl. No. 13/318,038, now U.S. Pat. No. 8,912,812.
Amendment and Response Under Rule 1.116 and Termination Disclaimer filed Sep. 4, 2014 in co-pending U.S. Appl. No. 13/318,038, now U.S. Pat. No. 8,912 812.
Terminal Disclaimer Review Decision dated Sep. 8, 2014 in co-pending U.S. Appl. No. 13/318,038, now U.S. Pat. No. 8,912,812.
Notice of Allowance and Fee(s) Due dated Sep. 30, 2014 in co-pending U.S. Appl. No. 13/318,038, now U.S. Pat. No. 8,912,812.
Restriction Requirement dated Dec. 9, 2013 in co-pending U.S. Appl. No. 13/318,171, now U.S. Pat. No. 8,789,272.
Response to Restriction Requirement filed Dec. 17, 2013 in co-pending U.S. Appl. No. 13/318,171, now U.S. Pat. No. 8,789,272.
Office Action dated Feb. 14, 2014 in co-pending U.S. Appl. No. 13/318,171, now U.S. Pat. No. 8,789,272.
Amendment and Response filed Feb. 26, 2014 in co-pending U.S. Appl. No. 13/318,171, now U.S. Pat. No. 8,789,272.
Notice of Allowance and Fee(s) Due dated Mar. 14, 2014 in co-pending U.S. Appl. No. 13/318,171, now U.S. Pat. No. 8,789,272.
Restriction Requirement dated Dec. 9, 2013 in co-pending U.S. Appl. No. 13/318,181, now published as US Patent Application Publication No. US 2012/0044659.
Response to Restriction Requirement filed Jan. 28, 2014 in co-pending U.S. Appl. No. 13/318,181, now published as US Patent Application Publication No. US 2012/0044659.
Office Action dated Apr. 21, 2014 in co-pending U.S. Appl. No. 13/318,181, now published as US Patent Application Publication No. US 2012/0044659.
Amendment and Response filed Jul. 27, 2014 in co-pending U.S. Appl. No. 13/318,181, now published as US Patent Application Publication No. US 2012/0044659.

(56) References Cited

OTHER PUBLICATIONS

Notice of Allowance and Fee(s) Due dated Oct. 24, 2014 in co-pending U.S. Appl. No. 13/318,181, now published as US Patent Application Publication No. US 2012/0044659.
Supplemental Notice of Allowance dated Dec. 19, 2014 in co-pending U.S. Appl. No. 13/318,181, now published as US Patent Application Publication No. US 2012/0044659.
Restriction Requirement dated Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication dated May 30, 2013 in co-pending U.S. Appl. No. 13/318,200, now published as US Patent Application Publication No. US 2012/0056332.
Office Action dated May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Final Office Action dated Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action dated Dec. 6, 2013 in co-pending U.S. Appl. No. 13/318,200, now published as US Patent Application Publication No. US 2012/0056332.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Office Action dated Nov. 19, 2014 in co-pending U.S. Appl. No. 13/318,200, now published as US Patent Application Publication No. US 2012/0056332.
Amendment and Response filed Mar. 19, 2015 in co-pending U.S. Appl. No. 13/318,200, now published as US Patent Application Publication No. US 2012/0056332.
Notice of Allowance and Fee(s) Due dated Apr. 13, 2015 in co-pending U.S. Appl. No. 13/318,200, now published as US Patent Application Publication No. US 2012/0056332.
Office Action dated Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action dated Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance dated Oct. 28, 2013 in co-pending U.S. Appl. No. 13/318,263, now published as US Patent Application Publication No. US 2012/0043667.
Notice of Allowance and Fee(s) Due dated May 18, 2015 in co-pending U.S. Appl. No. 14/086,029, now U.S. Pat. No. 9,076,884.
Office Action dated Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.

Final Office Action dated Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action dated Feb. 26, 2014 in co-pending U.S. Appl. No. 13/320,285, now published as US Patent Application Publication No. US 2012/0055702.
RCE filed Mar. 10, 2014 in co-pending U.S. Appl. No. 13/320,285, now published as US Patent Application Publication No. US 2012/0055702.
Office Action dated Jul. 29, 2014 in co-pending U.S. Appl. No. 13/320,285, now published as US Patent Application Publication No. US 2012/0055702.
Amendment and Response and Examiner's Interview Summary filed Oct. 15, 2014 in co-pending U.S. Appl. No. 13/320,285, now published as US Patent Application Publication No. US 2012/0055702.
Final Office Action dated Mar. 16, 2015 in co-pending U.S. Appl. No. 13/320,285, now published as US Patent Application Publication No. US 2012/0055702.
Amendment and Response Under Rule 1.116 filed Apr. 30, 2015 in co-pending U.S. Appl. No. 13/320,285, now published as US Patent Application Publication No. US 2012/0055702.
Advisory Action dated May 14, 2015 in co-pending U.S. Appl. No. 13/320,285, now published as US Patent Application Publication No. US 2012/0055702.
RCE filed Jun. 3, 2015 in co-pending U.S. Appl. No. 13/320,285, now published as US Patent Application Publication No. US 2012/0055702.
Office Action dated Jul. 21, 2015 in co-pending U.S. Appl. No. 13/320,285, now published as US Patent Application Publication No. US 2012/0055702.
Restriction Requirement dated Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Office Action dated Nov. 14, 2014 in co-pending U.S. Appl. No. 13/318,369, now published as US Patent Application Publication No. US 2012/0043119.
Amendment and Response filed Apr. 14, 2015 in co-pending U.S. Appl. No. 13/318,369, now published as US Patent Application Publication No. US 2012/0043119.
Final Office Action dated Jun. 30, 2015 in co-pending U.S. Appl. No. 13/318,369, now published as US Patent Application Publication No. US 2012/0043119.
Office Action dated Aug. 26, 2014 in co-pending U.S. Appl. No. 13/318,382, now published as US Patent Application Publication No. US 2012/0043130.
Amendment and Response and Terminal Disclaimer filed Nov. 14, 2014 in co-pending U.S. Appl. No. 13/318,382, now published as US Patent Application Publication No. US 2012/0043130.
Final Office Action dated Feb. 10, 2015 in co-pending U.S. Appl. No. 13/318,382, now published as US Patent Application Publication No. US 2012/0043130.
Advisory Action dated Apr. 20, 2015 in co-pending U.S. Appl. No. 13/318,382, now published as US Patent Application Publication No. US 2012/0043130.
Notice of Appeal filed May 7, 2015 in co-pending U.S. Appl. No. 13/318,382, now published as US Patent Application Publication No. US 2012/0043130.
Appeal Brief filed Jun. 24, 2015 in co-pending U.S. Appl. No. 13/318,382, now published as US Patent Application Publication No. US 2012/0043130.
Restriction Requirement dated Sep. 26, 2013 in co-pending U.S. Appl. No. 13/319,120 now U.S. Pat. No. 8,981,568.
Response to Restriction Requirement filed Oct. 8, 2013 in co-pending U.S. Appl. No. 13/319,120, now U.S. Pat. No. 8,981,568.
Notice of Non-Compliant Amendment dated Oct. 15, 2013 in co-pending U.S. Appl. No. 13/319,120, now U.S. Pat. No. 8,981,568.

(56) References Cited

OTHER PUBLICATIONS

Response to Restriction Requirement filed Oct. 18, 2013 in co-pending U.S. Appl. No. 13/319,120, now U.S. Pat. No. 8,981,568.
Office Action dated Jan. 17, 2014 in co-pending U.S. Appl. No. 13/319,120, now U.S. Pat. No. 8,981,568.
Amendment and Response filed Apr. 16, 2014 in co-pending U.S. Appl. No. 13/319,120, now U.S. Pat. No. 8,981,568.
Final Office Action dated Jul. 31, 2014 in co-pending U.S. Appl. No. 13/319,120, now U.S. Pat. No. 8,981,568.
Applicant-Initiated Interview Summary dated Sep. 12, 2014 in co-pending U.S. Appl. No. 13/319,120, now U.S. Pat. No. 8,981,568.
Amendment and Response and RCE filed Oct. 1, 2014 in co-pending U.S. Appl. No. 13/319,120, now U.S. Pat. No. 8,981,568.
Notice of Allowance and Fee(s) Due dated Oct. 27, 2014 in co-pending U.S. Appl. No. 13/319,120, now U.S. Pat. No. 8,981 568.
Restriction Requirement dated Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action dated Jun. 27, 2014 in co-pending U.S. Appl. No. 13/319,158, now published as US Patent Application Publication No. 2012/0051016.
Amendment and Response filed Sep. 3, 2014 in co-pending U.S. Appl. No. 13/319,158, now published as US Patent Application Publication No. 2012/0051016.
Final Office Action dated Nov. 6, 2014 in co-pending U.S. Appl. No. 13/319,158, now published as US Patent Application Publication No. 2012/0051016.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action dated Jan. 2, 2015 in co-pending U.S. Appl. No. 13/319,158, now published as US Patent Application Publication No. 2012/0051016.
Amendment and Response with RCE filed Feb. 5, 2015 in co-pending U.S. Appl. No. 13/319,158, now published as US Patent Application Publication No. 2012/0051016.
Office Action dated Apr. 23, 2015 in co-pending U.S. Appl. No. 13/319,158, now published as US Patent Application Publication No. 2012/0051016.
Office Action dated Feb. 27, 2014 in co-pending U.S. Appl. No. 13/319,203, now published as US Patent Application Publication No. 2012/0056640.
Amendment and Response filed Jun. 10, 2014 in co-pending U.S. Appl. No. 13/319,203, now published as US Patent Application Publication No. 2012/0056640.
Final Office Action dated Aug. 20, 2014 in co-pending U.S. Appl. No. 13/319,203, now published as US Patent Application Publication No. 2012/0056640.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary dated Oct. 9, 2014 in co-pending U.S. Appl. No. 13/319,203, now published as US Patent Application Publication No. 2012/0056640.
Advisory Action dated Oct. 16, 2014 in co-pending U.S. Appl. No. 13/319,203, now published as US Patent Application Publication No. 2012/0056640.
Request for Continued Examination filed Nov. 12, 2014 in co-pending U.S. Appl. No. 13/319,203, now published as US Patent Application Publication No. 2012/0056640.
Notice of Allowance and Fee(s) Due dated Dec. 10, 2014 in co-pending U.S. Appl. No. 13/319,203, now published as US Patent Application Publication No. 2012/0056640.
Response to Restriction Requirement filed Oct. 4, 2013 in co-pending U.S. Appl. No. 13/266,573, now U.S. Pat. No. 9,054,097.
Office Action dated Feb. 21, 2014 in co-pending U.S. Appl. No. 13/266,573, now U.S. Pat. No. 9,054,097.
Amendment and Response filed Feb. 26, 2014 in co-pending U.S. Appl. No. 13/266,573, now U.S. Pat. No. 9,054,097.
Office Action dated Jul. 3, 2014 in co-pending U.S. Appl. No. 13/266,573, now U.S. Pat. No. 9,054,097.
Amendment and Response filed Sep. 9, 2014 in co-pending U.S. Appl. No. 13/266,573, now U.S. Pat. No. 9,054,097.
Notice of Allowance and Fee(s) Due dated Apr. 9, 2015 in co-pending U.S. Appl. No. 13/266,573, now U.S. Pat. No. 9,054,097.
Examiner-Initiated Interview Summary dated Mar. 14, 2013 in co-pending U.S. Appl. No. 13/319,228, now U.S. Pat. No. 8,984,748.
Restriction Requirement dated Apr. 23, 2014 in co-pending U.S. Appl. No. 13/319,228, now U.S. Pat. No. 8,984,748.
Response to Restriction Requirement filed Jun. 23, 2014 in co-pending U.S. Appl. No. 13/319,228, now U.S. Pat. No. 8,984,748.
Office Action dated Sep. 4, 2014 in co-pending U.S. Appl. No. 13/319,228, now U.S. Pat. No. 8,984,748.
Amendment and Response and Terminal Disclaimer filed Nov. 17, 2014 in co-pending U.S. Appl. No. 13/319,228, now U.S. Pat. No. 8,984 748.
Notice of Allowance and Fee(s) Due dated Jan. 13, 2015 in co-pending U.S. Appl. No. 13/319,228, now U.S. Pat. No. 8,984,748.
Restriction Requirement dated Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action dated Mar. 4, 2014 in co-pending U.S. Appl. No. 13/575,368, now published as US Patent Application Publication No. 2013/0203273.
Notice of Abandonment dated Oct. 10, 2014 in co-pending U.S. Appl. No. 13/575,368, now published as US Patent Application Publication No. 2013/0203273.
Office Action dated Sep. 17, 2014 in co-pending U.S. Appl. No. 13/643,436, now published as US Patent Application Publication No. 2013/0105984.
Amendment and Response filed Nov. 19, 2014 in co-pending U.S. Appl. No. 13/643,436, now published as US Patent Application Publication No. 2013/0105984.
Notice of Allowance and Fee(s) Due dated Feb. 9, 2015 in co-pending U.S. Appl. No. 13/643,436, now published as US Patent Application Publication No. 2013/0105984.
Office Action dated Apr. 24, 2014 in co-pending U.S. Appl. No. 13/700,639, now published as US Patent Application Publication No. 2013/0078860.
Amendment and Response filed Jul. 30, 2014 in co-pending U.S. Appl. No. 13/700,639, now published as US Patent Application Publication No. 2013/0078860.
Final Office Action dated Sep. 8, 2014 in co-pending U.S. Appl. No. 13/700,639, now published as US Patent Application Publication No. 2013/0078860.
Response Under Rule 1.116 filed Nov. 11, 2014 in co-pending U.S. Appl. No. 13/700,639, now published as US Patent Application Publication No. 2013/0078860.
Advisory Action dated Dec. 3, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Restriction Requirement dated Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Office Action dated Apr. 2, 2015 in co-pending U.S. Appl. No. 13/700,639, now published as US Patent Application Publication No. 2013/0078860.

(56) References Cited

OTHER PUBLICATIONS

Final Office Action dated Jul. 23, 2015 in co-pending U.S. Appl. No. 13/700,639, now published as US Patent Application Publication No. 2013/0078860.
Notice of Allowance and Fee(s) Due dated Sep. 25, 2015 in co-pending U.S. Appl. No. 13/700,639, now published as US Patent Application Publication No. 2013/0078860.
Restriction Requirement dated Jun. 5, 2014 in co-pending U.S. Appl. No. 13/879,783, now published as US Patent Application Publication No. 2013/0223034.
Response to Restriction Requirement filed Jul. 17, 2014 in co-pending U.S. Appl. No. 13/879,783, now published as US Patent Application Publication No. 2013/0223034.
Office Action dated Oct. 6, 2014 in co-pending U.S. Appl. No. 13/879,783, now published as US Patent Application Publication No. 2013/0223034.
Amendment and Response filed Feb. 3, 2015 in co-pending U.S. Appl. No. 13/879,783, now published as US Patent Application Publication No. 2013/0223034.
Final Office Action dated Apr. 23, 2015 in co-pending U.S. Appl. No. 13/879,783, now published as US Patent Application Publication No. 2013/0223034.
Amendment and Response Under Rule 1.116 filed Apr. 28, 2015 in co-pending U.S. Appl. No. 13/879,783, now published as US Patent Application Publication No. 2013/0223034.
Advisory Action dated May 14, 2015 in co-pending U.S. Appl. No. 13/879,783, now published as US Patent Application Publication No. 2013/0223034.
Office Action dated Nov. 17, 2014 in co-pending U.S. Appl. No. 13/879,883, now U.S. Pat. No. 9,093,767.
Amendment and Response filed Mar. 10, 2015 in co-pending U.S. Appl. No. 13/879,883, now U.S. Pat. No. 9,093,767.
Notice of Allowance and Fee(s) Due dated May 28, 2015 in co-pending U.S. Appl. No. 13/879,883, now U.S. Pat. No. 9,093,767.
Restriction Requirement dated Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action dated May 4, 2015 in co-pending U.S. Appl. No. 13/880,231, now published as US Patent Application Publication No. 2013/0210276.
Office Action dated May 22, 2015 in co-pending U.S. Appl. No. 13/880,231, now published as US Patent Application Publication No. 2013/0210276.
Restriction Requirement dated Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action dated Dec. 16, 2013 in co-pending U.S. Appl. No. 13/410,914, now published as US Patent Application Publication No. US 2012/0164888.
Amendment and Response filed Mar. 17, 2014 in co-pending U.S. Appl. No. 13/410,914, now published as US Patent Application Publication No. US 2012/0164888.
Final Office Action dated Jun. 4, 2014 in co-pending U.S. Appl. No. 13/410,914, now published as US Patent Application Publication No. US 2012/0164888.
Amendment and Response Under Rule 1.116 filed Jul. 29, 2014 in co-pending U.S. Appl. No. 13/410,914, now published as US Patent Application Publication No. US 2012/0164888.
Advisory Action dated Aug. 12, 2014 in co-pending U.S. Appl. No. 13/410,914, now published as US Patent Application Publication No. US 2012/0164888.
Amendment and Response and RCE filed Sep. 30, 2014 in co-pending U.S. Appl. No. 13/410,914, now published as US Patent Application Publication No. US 2012/0164888.
Office Action dated Dec. 26, 2014 in co-pending U.S. Appl. No. 13/410,914, now published as US Patent Application Publication No. US 2012/0164888.
Amendment and Response filed Mar. 26, 2015 in co-pending U.S. Appl. No. 13/410,914, now published as US Patent Application Publication No. US 2012/0164888.
Notice of Allowance and Fee(s) Due dated Jun. 4, 2015 in co-pending U.S. Appl. No. 13/410,914, now published as US Patent Application Publication No. US 2012/0164888.
Restriction Requirement dated Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Office Action dated Feb. 27, 2015 in co-pending U.S. Appl. No. 13/410,943, now published as US Patent Application Publication No. US 2012/0161317.
Amendment and Response filed May 21, 2015 in co-pending U.S. Appl. No. 13/410,943, now published as US Patent Application Publication No. US 2012/0161317.
Office Action dated Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Notice of Allowance and Fee(s) Due dated Feb. 26, 2014 in co-pending U.S. Appl. No. 13/412,870, now published as US Patent Application Publication No. US 2012/0171907.
Restriction Requirement dated Nov. 19, 2014 in co-pending U.S. Appl. No. 13/413,032, now U.S. Pat. No. 8,988,093.
Response to Restriction Requirement filed Nov. 20, 2014 in co-pending U.S. Appl. No. 13/413,032, now U.S. Pat. No. 8,988,093.
Notice of Allowance and Fee(s) Due dated Jan. 5, 2015 in co-pending U.S. Appl. No. 13/413,032, now U.S. Pat. No. 8,988,093.
Office Action dated Apr. 30, 2013 in co-pending U.S. Appl. No. 13/413,724, now U.S. Pat. No. 8,987,886.
Amendment and Response filed May 7, 2013 in co-pending U.S. Appl. No. 13/413,724, now U.S. Pat. No. 8,987,886.
Notice of Non-Compliant Amendment dated May 16, 2013 in co-pending U.S. Appl. No. 13/413,724, now U.S. Pat. No. 8,987,886.
Revised Amendment and Response filed May 17, 2013 in co-pending U.S. Appl. No. 13/413,724, now U.S. Pat. No. 8,987,886.
Office Action dated Sep. 16, 2013 in co-pending U.S. Appl. No. 13/413,724, now U.S. Pat. No. 8,987,886.
Amendment and Response filed Nov. 20, 2013 in co-pending U.S. Appl. No. 13/413,724, now U.S. Pat. No. 8,987,886.
Final Office Action dated Feb. 14, 2014 in co-pending U.S. Appl. No. 13/413,724, now U.S. Pat. No. 8,987,886.
Amendment and Response to Final Office filed Feb. 26, 2014 in co-pending U.S. Appl. No. 13/413,724, now U.S. Pat. No. 8,987,886.
Advisory Action dated Mar. 28, 2014 in co-pending U.S. Appl. No. 13/413,724, now U.S. Pat. No. 8,987,886.
Second Amendment and Response filed Apr. 14, 2014 in co-pending U.S. Appl. No. 13/413,724, now U.S. Pat. No. 8,987,886.
Notice of Allowance and Fee(s) Due dated May 9, 2014 in co-pending U.S. Appl. No. 13/413,724, now U.S. Pat. No. 8,987,886.
Restriction Requirement dated Apr. 10, 2014 in co-pending U.S. Appl. No. 13/418,853, now published as US Patent Application Publication No. US 2012/0244728.
Response to Restriction Requirement filed Apr. 23, 2014 in co-pending U.S. Appl. No. 13/418,853, now published as US Patent Application Publication No. US 2012/0244728.
Office Action dated Jun. 26, 2014 in co-pending U.S. Appl. No. 13/418,853, now published as US Patent Application Publication No. US 2012/0244728.
Amendment and Response filed Aug. 26, 2014 in co-pending U.S. Appl. No. 13/418,853, now published as US Patent Application Publication No. US 2012/0244728.

(56) References Cited

OTHER PUBLICATIONS

Final Office Action dated Oct. 28, 2014 in co-pending U.S. Appl. No. 13/418,853, now published as US Patent Application Publication No. US 2012/0244728.
Amendment and Response with RCE filed Jan. 28, 2015 in co-pending U.S. Appl. No. 13/418,853, now published as US Patent Application Publication No. US 2012/0244728.
Office Action dated Feb. 20, 2015 in co-pending U.S. Appl. No. 13/418,853, now published as US Patent Application Publication No. US 2012/0244728.
Amendment and Response filed May 12, 2015 in co-pending U.S. Appl. No. 13/418,853, now published as US Patent Application Publication No. US 2012/0244728.
Notice of Allowance and Fee(s) Due dated Jul. 7, 2015 in co-pending U.S. Appl. No. 13/418,853, now published as US Patent Application Publication No. US 2012/0244728.
Notice of Allowance and Fee(s) Due dated Oct. 2, 2013 in co-pending U.S. Appl. No. 13/448,865, now published as US Patent Application Publication No. US 2012/0199985.
Notice of Allowance and Fee(s) Due dated Dec. 6, 2013 in co-pending U.S. Appl. No. 14/058,863, now published as US Patent Application Publication No. 2014/0043782.
Office Action dated Mar. 20, 2014 in co-pending U.S. Appl. No. 14/058,863, now published as US Patent Application Publication No. 2014/0043782.
Office Action dated Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due dated Apr. 17, 2014 in co-pending U.S. Appl. No. 14/058,863, now published as US Patent Application Publication No. 2014/0043782.
Office Action dated May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due dated Jul. 28, 2013 in co-pending U.S. Appl. No. 13/448,914, now published as US Patent Application Publication No. US 2012/0202364.
Office Action dated Oct. 7, 2013 in co-pending U.S. Appl. No. 13/969,953, now U.S. Pat. No. 8,704,377.
Amendment and Response and Terminal Disclaimer filed Nov. 20, 2013 in co-pending U.S. Appl. No. 13/969,953, now U.S. Pat. No. 8,704,377.
Final Office Action dated Dec. 20, 2013 in co-pending U.S. Appl. No. 13/969,953, now U.S. Pat. No. 8,704,377.
Amendment and Response to Final Office filed Dec. 30, 2013 in co-pending U.S. Appl. No. 13/969,953, now U.S. Pat. No. 8,704,377.
Notice of Allowance and Fee(s) Due dated Jan. 22, 2014 in co-pending U.S. Appl. No. 13/969,953, now U.S. Pat. No. 8,704,377.
Co-pending U.S. Appl. No. 14/327,916 titled Matrix Defined Electrical Circuit Structure, filed Jul. 10, 2014.
Notification of Transmittal of the International Search Report and the Written Opinion of the International Searching Authority dated Jun. 19, 2012 in International Application No. PCT/US2012/027823.
Notification of Transmittal of the International Search Report and the Written Opinion of the International Searching Authority dated Nov. 29, 2012 in International Application No. PCT/US2012/053848.
Notification of Transmittal of the International Search Report and the Written Opinion of the International Searching Authority dated Jun. 3, 2013 in International Application No. PCT/US2013/031395.
Notification of Transmittal of the International Search Report and the Written Opinion of the International Searching Authority dated Jun. 19, 2013 in International Application No. PCT/US2013/030981.
Notification of Transmittal of the International Search Report and the Written Opinion of the International Searching Authority dated Jun. 7, 2013 in International Application No. PCT/US2013/030856.
Notification of Transmittal of the International Search Report and the Written Opinion of the International Searching Authority dated Oct. 27, 2014 in International Application No. PCT/US2014/045856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Print—Definition of Print by the Free Dictionary, http://www.thefreedictionary.com/print, Aug. 13, 2014.
U.S. Appl. No. 13/318,369, filed Nov. 1, 2011, 2012/0043119, U.S. Pat. No. 9,277,654, Composite Polymer-Metal Electrical Contacts.
U.S. Appl. No. 13/318,382, filed Nov. 1, 2011, 2012/0043130, U.S. Pat. No. 9,231,328, Resilient Conductive Electrical Interconnect.
U.S. Appl. No. 13/319,158, filed Nov. 7, 2011, 2012/0051016, U.S. Pat. No. 9,320,144, Semiconductor Socket.
U.S. Appl. No. 13/643,436, filed Oct. 25, 2012, 2013/0105984, U.S. Pat. No. 9,184,145, Semiconductor Device Package Adapter.
U.S. Appl. No. 13/700,639, filed Nov. 28, 2012, 2013/0078860, U.S. Pat. No. 9,184,527, Electrical Connector Insulator Housing.
U.S. Appl. No. 13/879,783, filed Apr. 16, 2013, 2013/0223034, U.S. Pat. No. 9,232,654, High Performance Electrical Circuit Structure.
U.S. Appl. No. 13/880,231, filed Apr. 18, 2013, 2013/0210276, U.S. Pat. No. 9,276,339, Electrical Interconnect IC Device Socket.
U.S. Appl. No. 13/880,461, filed Apr. 19, 2013, 2013/0206468, U.S. Pat. No. 9,320,133, Electrical Interconnect IC Device Socket.
U.S. Appl. No. 13/410,914, filed Mar. 2, 2012, 2012/0164888, U.S. Pat. No. 9,276,336, Metalized Pad to Electrical Contact Interface.
U.S. Appl. No. 13/418,853, filed Mar. 13, 2012, 2012/0244728, U.S. Pat. No. 9,196,980, High Performance Surface Mount Electrical Interconnect With External Biased Normal Force Loading.
U.S. Appl. No. 14/408,338, filed Dec. 16, 2014, 2015-0279768, Semiconductor Socket With Direct Selective Metalization.
U.S. Appl. No. 14/254,038, filed Apr. 16, 2014, 2014/0220797, U.S. Pat. No. 9,318,862, High Performance Electrical Connector With Translated Insulator Contact Positioning.
U.S. Appl. No. 14/327,916, filed Jul. 10, 2014, 2015/0013901, Matrix Defined Electrical Circuit Structure.
U.S. Appl. No. 14/864,215, filed Sep. 24, 2015, 2016-0014908, Fusion Bonded Liquid Crystal Polymer Electrical Circuit Structure.
U.S. Appl. No. 15/062,136, filed Mar. 6, 2016, Mechanical Contact Retention Within an Electrical Connector.
U.S. Appl. No. 15/062,137, filed Mar. 6, 2016, Electrodeposited Contact Terminal for Use as an Electrical Connector or Semiconductor Packaging Substrate.
U.S. Appl. No. 15/070,026, filed Mar. 15, 2016, Fusion Bonded Formable Liquid Crystal Polymer Electrical Circuit Structure.
U.S. Appl. No. 15/062,138, filed Mar. 6, 2015, Low Profile Electrical Interconnect With Fusion Bonded Contact Retention and Solder Wick Prevention.
European Search Report for EP 14 82 2548 dated Nov. 2, 2016.
European Search Report for EP 3 076 772 A3 dated Sep. 9, 2016.
U.S. Appl. No. 13/266,486, filed Oct. 27, 2011, 2012/0055701, U.S. Pat. No. 8,955,215, High Performance Surface Mount Electrical Interconnect.

(56) References Cited

OTHER PUBLICATIONS

U.S. Appl. No. 14/621,663, filed Feb. 13, 2015, 2015/0162678, High Performance Surface Mount Electrical Interconnect.
U.S. Appl. No. 13/266,522, filed Oct. 27, 2011, 2012/0068727, U.S. Pat. No. 8,803,539, Compliant Wafer Level Probe Assembly.
U.S. Appl. No. 13/266,573, filed Oct. 27, 2011, 2012/0061846, U.S. Pat. No. 9,054,097, Compliant Printed Circuit Area Array Semiconductor Device Package.
U.S. Appl. No. 13/266,907, filed Oct. 28, 2011, 2012/0268155, U.S. Pat. No. 8,928,344, Compliant Printed Circuit Socket Diagnostic Tool.
U.S. Appl. No. 13/318,038, filed Oct. 28, 2011, 2012/0062270, U.S. Pat. No. 8,912,812, Compliant Printed Circuit Wafer Probe Diagnostic Tool.
U.S. Appl. No. 13/318,171, filed Oct. 31, 2011, 2012/0049877, U.S. Pat. No. 8,789,272, Compliant Printed Circuit Peripheral Lead Semiconductor Test Socket.
U.S. Appl. No. 13/318,181, filed Oct. 31, 2011, 2012/0044659, U.S. Pat. No. 8,955,216, Compliant Printed Circuit Peripheral Lead Semiconductor Package.
U.S. Appl. No. 13/318,200, filed Oct. 31, 2011, 2012/0056332, U.S. Pat. No. 9,136,196, Compliant Printed Circuit Wafer Level Semiconductor Package.
U.S. Appl. No. 13/318,263, filed Oct. 31, 2011, 2012/0043667, U.S. Pat. No. 8,618,649, Compliant Printed Circuit Semiconductor Package.
U.S. Appl. No. 14/086,029, filed Nov. 21, 2013, 2014/0080258, U.S. Pat. No. 9,076,884, Compliant Printed Circuit Semiconductor Package.
U.S. Appl. No. 13/320,285, filed Nov. 14, 2011, 2012/005702, Compliant Printed Flexible Circuit.
U.S. Appl. No. 13/318,369, filed Nov. 1, 2011, 2012/0043119, Composite Polymer-Metal Electrical Contacts.
U.S. Appl. No. 13/318,382, filed Nov. 1, 2011, 2012/0043130, Resilient Conductive Electrical Interconnect.
U.S. Appl. No. 13/319,120, filed Nov. 7, 2011, 2012/0061851, U.S. Pat. No. 8,981,568, Simulated Wirebond Semiconductor Pakage.
U.S. Appl. No. 13/319,145, filed Nov. 7, 2011, 2012/0049342, U.S. Pat. No. 8,970,031, Semiconductor Die Terminal.
U.S. Appl. No. 13/319,158, filed Nov. 7, 2011, 2012/0051016, Semiconductor Socket.
U.S. Appl. No. 13/319,203, filed Nov. 7, 2011, 2012/0056640, U.S. Pat. No. 8,981,809, Compliant Printed Circuit Semiconductor Tester Interface.
U.S. Appl. No. 13/319,228, filed Nov. 7, 2011, 2012/0058653, U.S. Pat. No. 8,984,748, Singulated Semiconductor Device Separable Electrical Interconnect.
U.S. Appl. No. 13/575,368, filed Jul. 26, 2012, 2013/0203273, Abandoned, High Speed Backplane Connector.
U.S. Appl. No. 13/643,436, filed Oct. 25, 2012, 2013/0105984, Allowed, Semiconductor Device Package Adapter.
U.S. Appl. No. 13/700,639, filed Nov. 28, 2012, 2013/0078860, Electrical Connector Insulator Housing.
U.S. Appl. No. 13/879,783, filed Apr. 16, 2013, 2013/0223034, High Performance Electrical Circuit Structure.
U.S. Appl. No. 13/879,883, filed Apr. 17, 2013, 2013/0244490, U.S. Pat. No. 9,093,767, High Performance Surface Mount Electrical Interconnect.
U.S. Appl. No. 13/880,231, filed Apr. 18, 2013, 2013/0210276, Electrical Interconnect IC Device Socket.
U.S. Appl. No. 13/880,461, filed Apr. 19, 2013, 2013/0206468, Electrical Interconnect IC Device Socket.
U.S. Appl. No. 13/410,914, filed Mar. 2, 2012, 2012/0164888, Allowed, Metalized Pad to Electrical Contact Interface.
U.S. Appl. No. 13/410,943, filed Mar. 2, 2012, 2012/0161317, Area Array Semiconductor Device Package Interconnect Structure With Optional Package-to-Package or Flexible Circuit to Package Connection.
U.S. Appl. No. 13/412,870, filed Mar. 6, 2012, 2012/0171907, U.S. Pat. No. 8,758,067, Selective Metalization of Electrical Connector or Socket Housing.
U.S. Appl. No. 14/271,801, filed May 7, 2014, 2014/0242816, Selective Metalization of Electrical Connector or Socket Housing.
U.S. Appl. No. 13/413,032, filed Mar. 6, 2012, 2012/0182035, U.S. Pat. No. 8,988,093, Bumped Semiconductor Wafer or Die Level Electrical Interconnect.
U.S. Appl. No. 13/413,724, filed Mar. 7, 2012, 2012/0168948, U.S. Pat. No. 8,987,886, Copper Pillar Full Metal Via Electrical Circuit Structure.
U.S. Appl. No. 14/255,083, filed Apr. 17, 2014, 2014/0225255, Copper Pillar Full Metal Via Electrical Circuit Structure.
U.S. Appl. No. 13/418,853, filed Mar. 13, 2012, 2012/0244728, Allowed, High Performance Surface Mount Electrical Interconnect With External Biased Normal Force Loading.
U.S. Appl. No. 13/448,865, filed Apr. 17, 2012, 2012/0199985, U.S. Pat. No. 8,610,265, Compliant Conductive Nano-Particle Electrical Interconnect.
U.S. Appl. No. 14/058,863, filed Oct. 21, 2013, 2014/0043782, U.S. Pat. No. 8,829.671, Compliant Core Peripheral Lead Semiconductor Socket.
U.S. Appl. No. 13/448,914, filed Apr. 17, 2012, 2012/0202364, U.S. Pat. No. 8,525,346, Compliant Core Peripheral Lead Semiconductor Test Socket.
U.S. Appl. No. 13/969,953, filed Aug. 19, 2013, 2013/0330942, U.S. Pat. No. 8,704,377, Compliant Conductive Nano-Particle Electrical Interconnect.
U.S. Appl. No. 14/238,638, filed Feb. 12, 2014, 2014/0192498, Direct Metalization of Electrical Circuit Structure.
U.S. Appl. No. 14/408,205, filed Dec. 15, 2014, 2015/0181710, Hybrid Printed Circuit Assembly With Low Density Main Core and Embedded High Density Circuit Regions.
U.S. Appl. No. 14/408,039, filed Dec. 15, 2014, 2015/0136467, High Speed Circuit Assembly With Integral Terminal and Mating Bias Loading Electrical Connector Assembly.
U.S. Appl. No. 14/408,338, filed Dec. 16, 2014, Semiconductor Socket With Direct Selective Metalization.
U.S. Appl. No. 14/254,038, filed Apr. 16, 2014, 2014/0220797, High Performance Electrical Connector With Translated Insulator Contact Positioning.
U.S. Appl. No. 14/327,916, filed Jul. 10, 2014, 2015/0013901, Matrix Defined Electrical Circuit Strutcure.
U.S. Appl. No. 14/565,724, filed Dec. 10, 2014, 2015/0091600, Performance Enhanced Semiconductor Socket.

\* cited by examiner

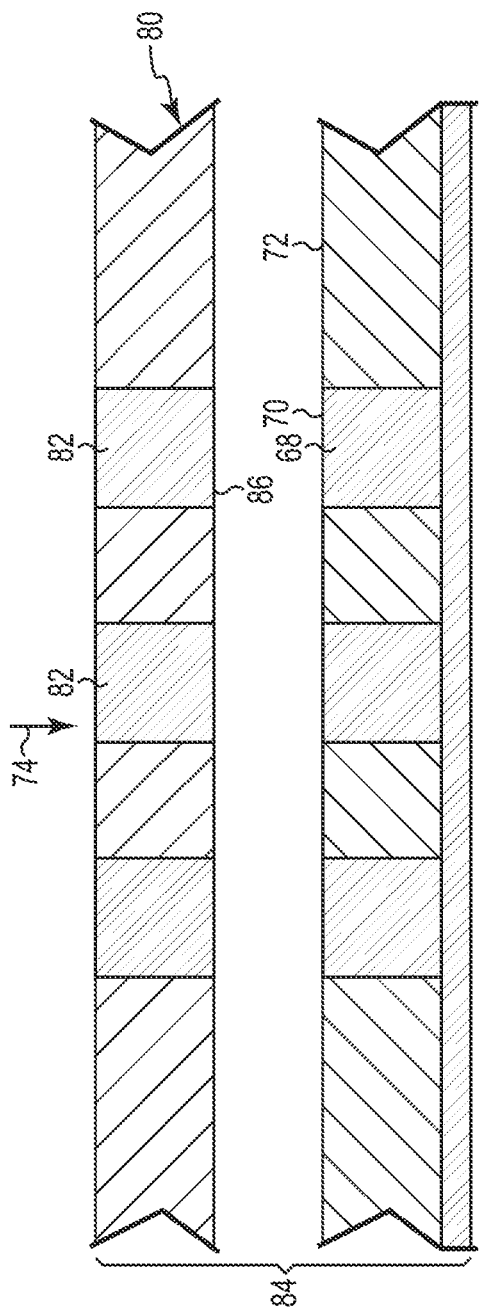
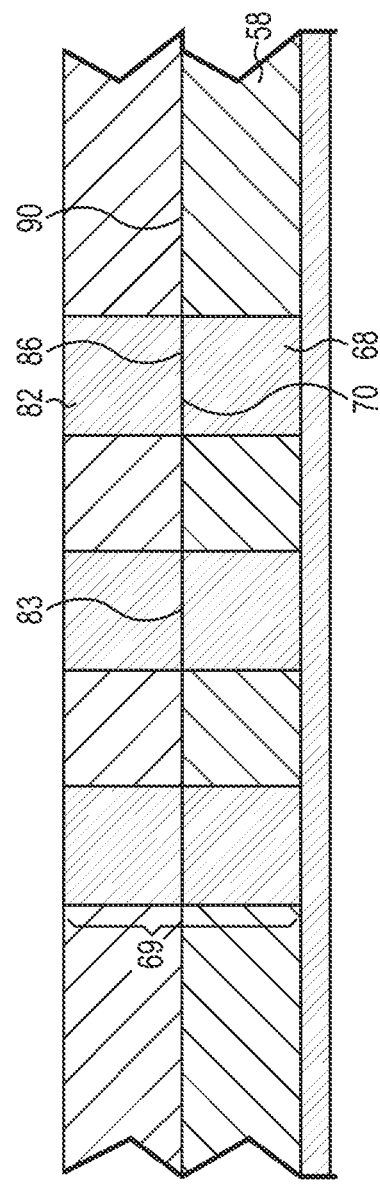
Fig. 3
Fig. 4

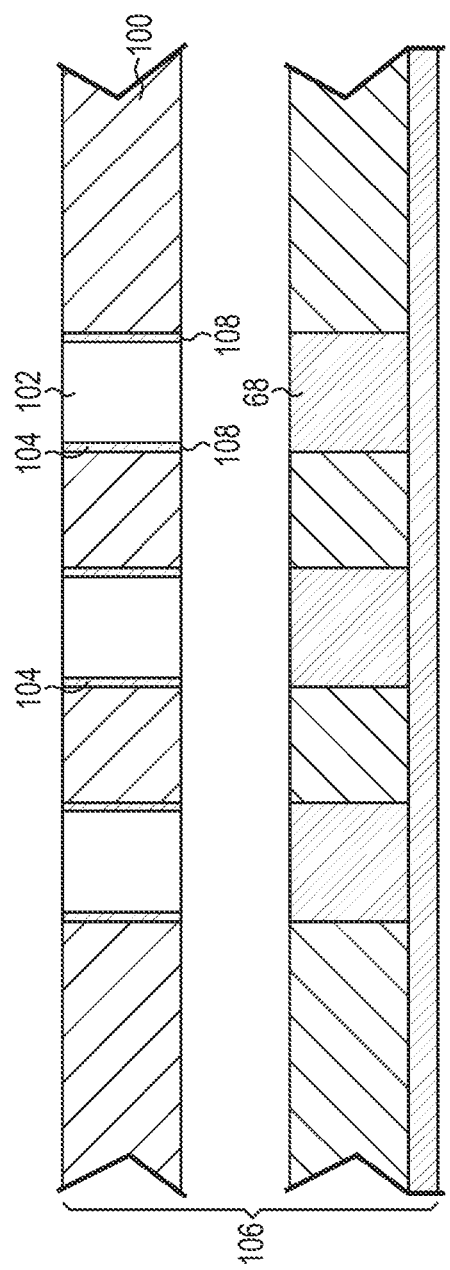
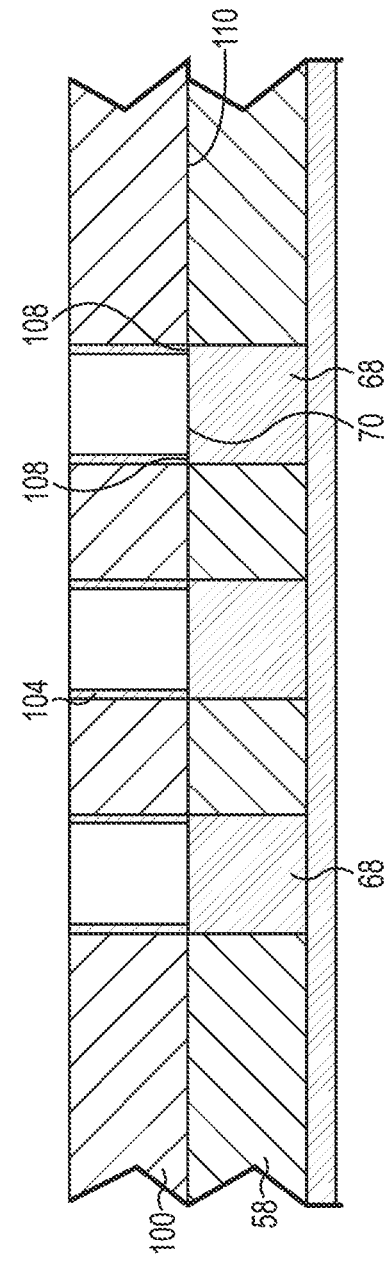
Fig. 5
Fig. 6

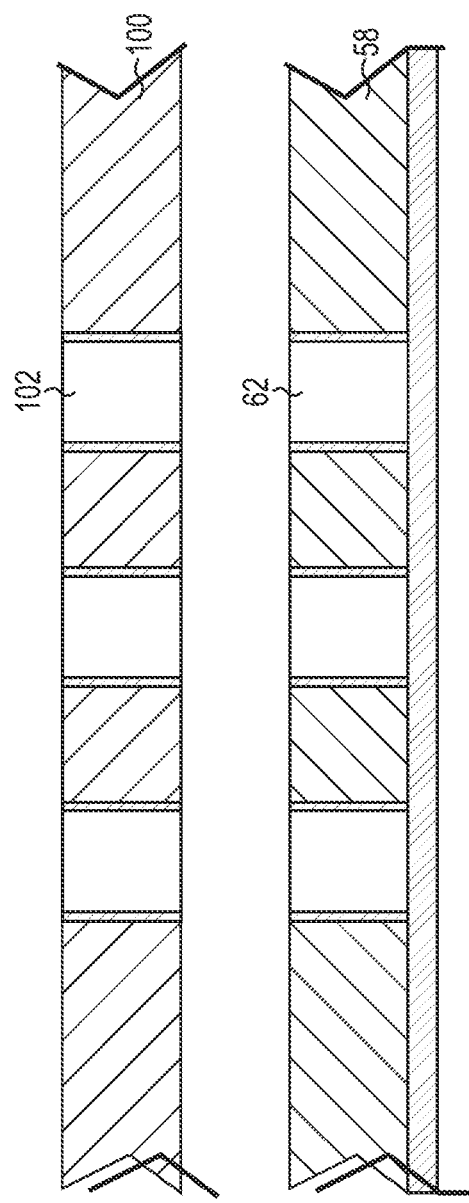
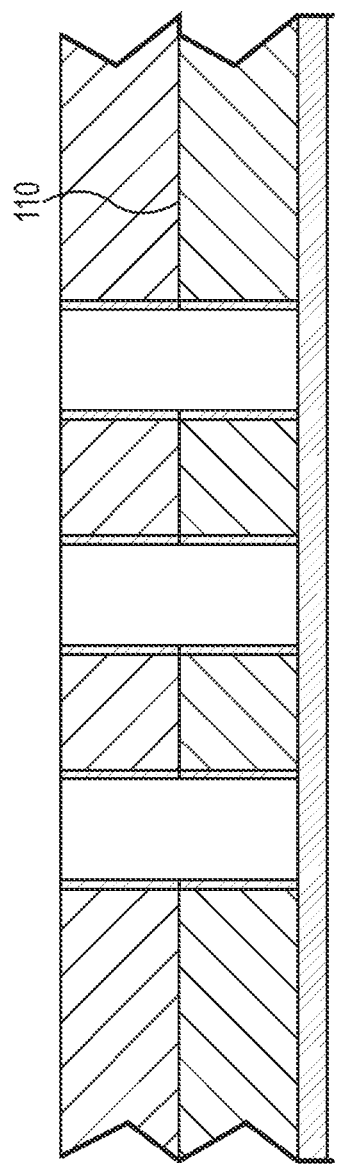
Fig. 7
Fig. 8

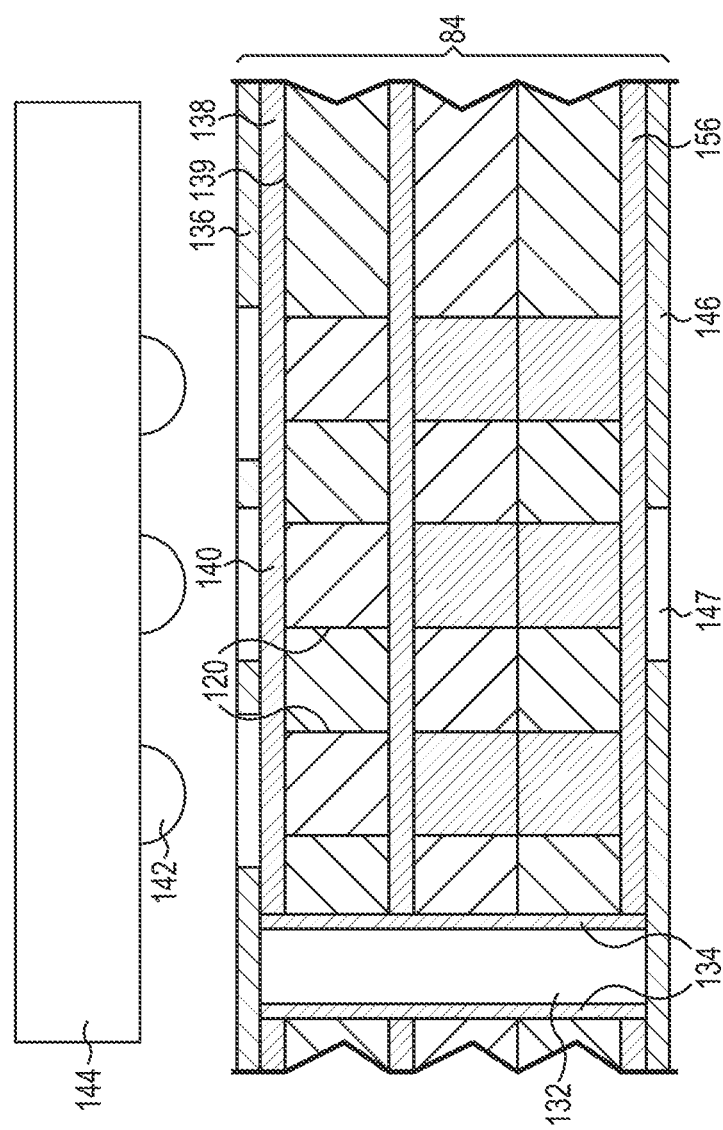

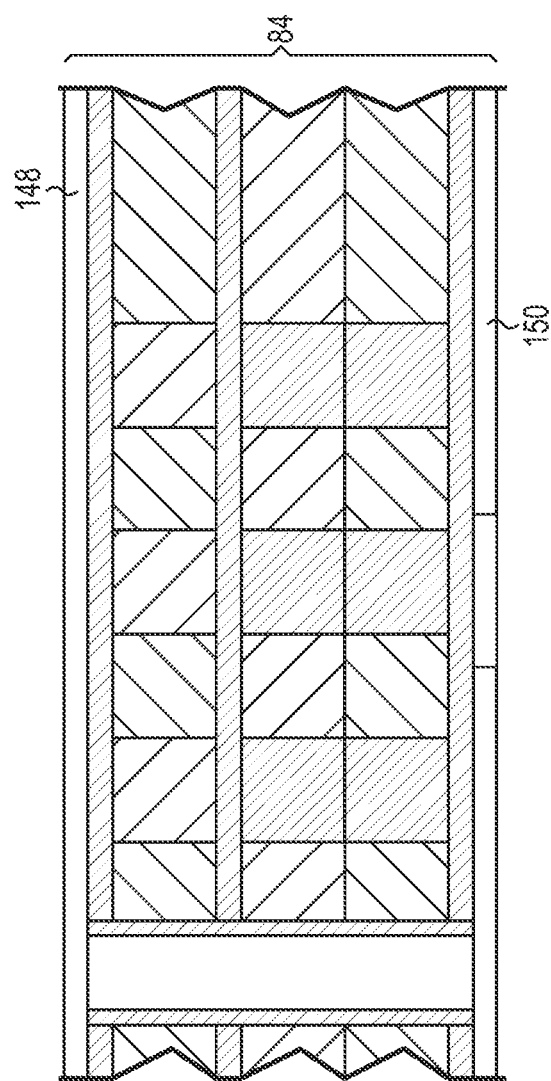

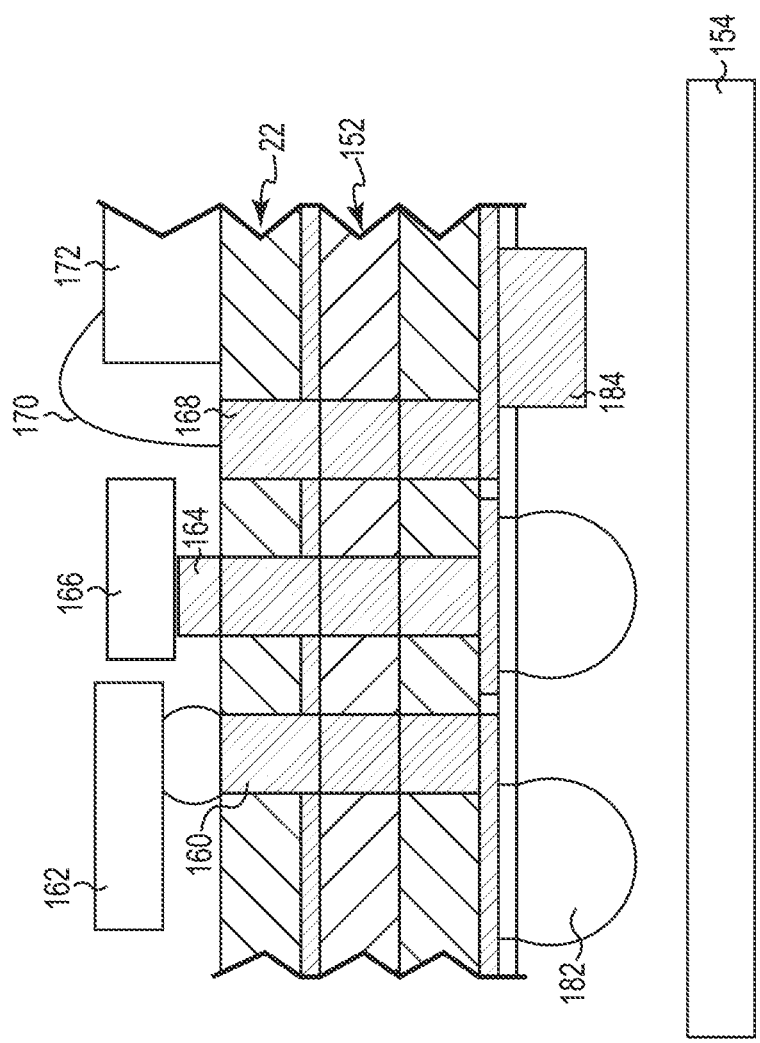

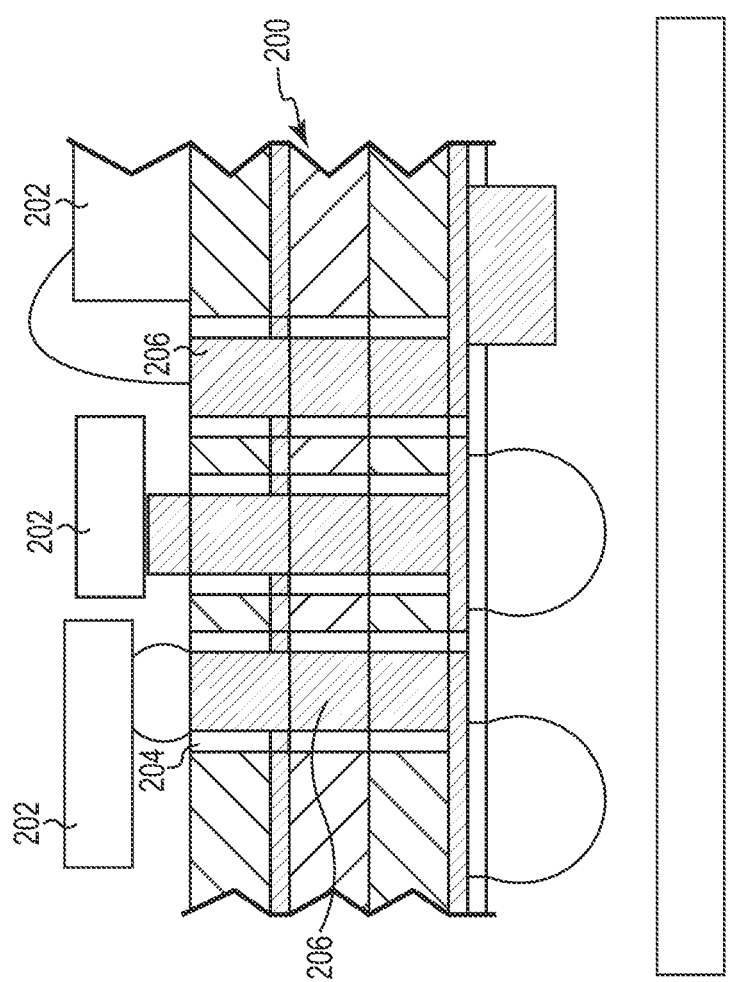

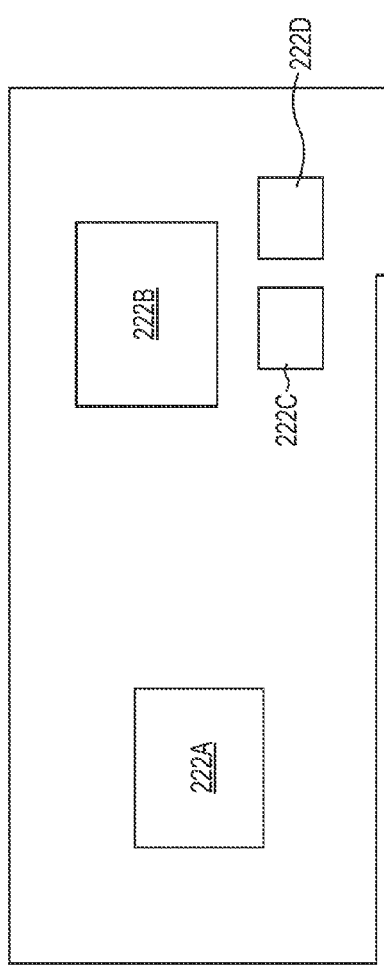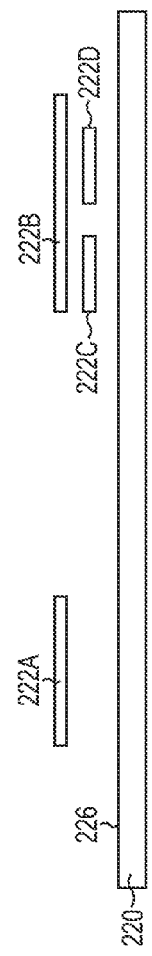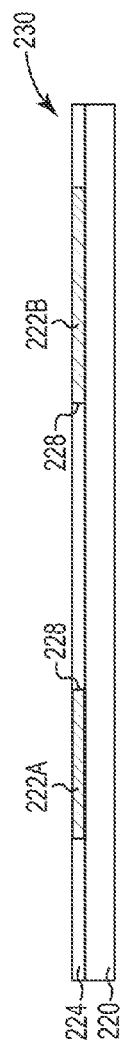

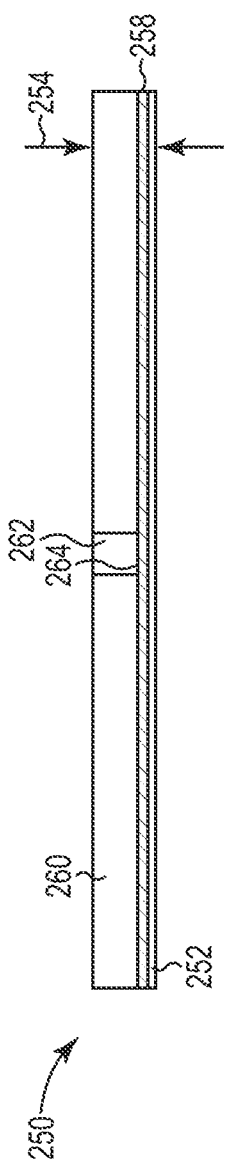
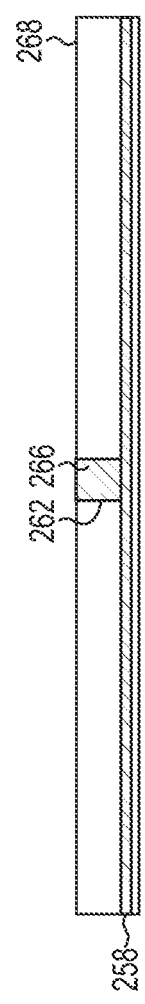
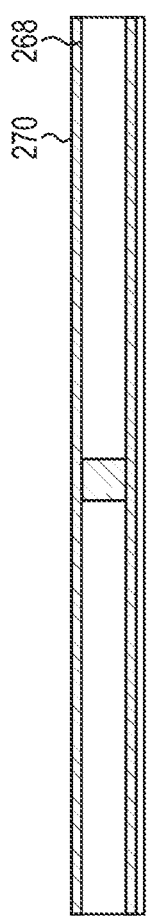
Fig. 17A
Fig. 17B
Fig. 17C

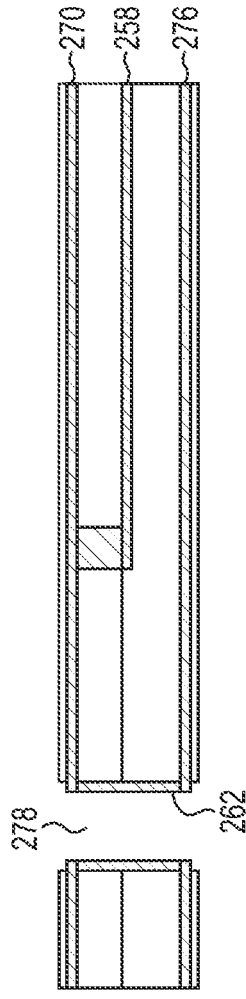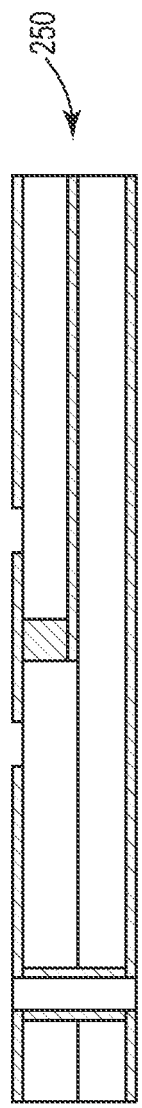

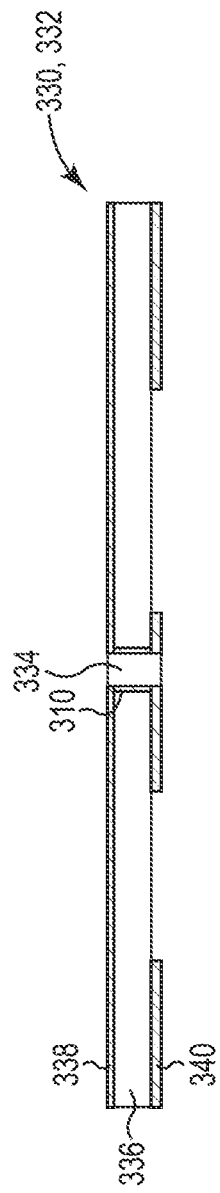
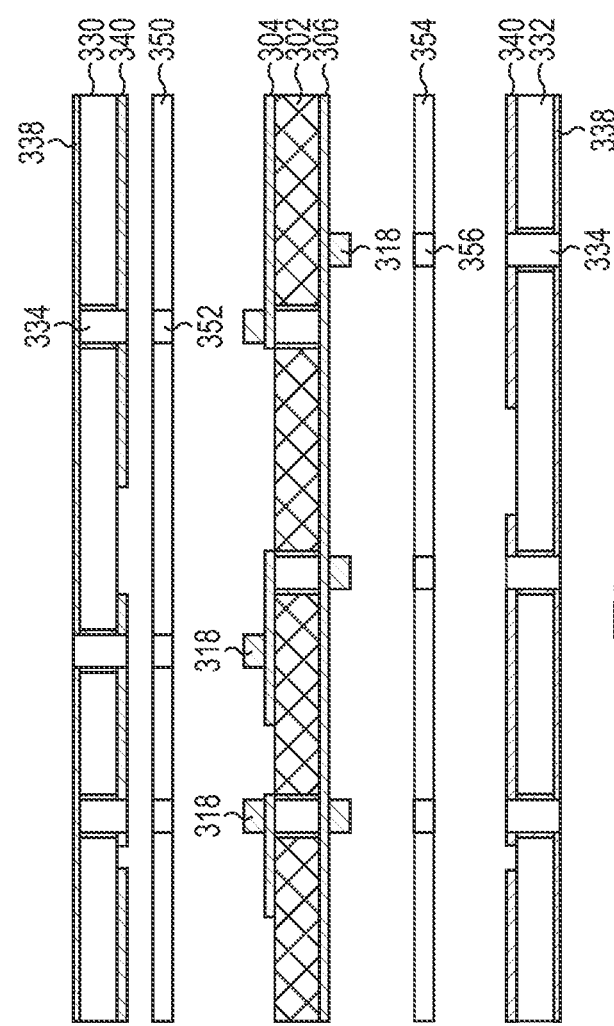
Fig. 18D
Fig. 19

FUSION BONDED LIQUID CRYSTAL POLYMER CIRCUIT STRUCTURE

CROSS-REFERENCE TO RELATED APPLICATIONS

This application is a continuation-in-part of International Application No. PCT/US2014/045856, entitled FUSION BONDED LIQUID CRYSTAL POLYMER ELECTRIC CIRCUIT STRUCTURE, filed Jul. 9, 2014, which claims priority to U.S. Provisional Application Nos. 61/845,088, filed Jul. 11, 2013 and 61/915,194 filed Dec. 12, 2013, the disclosures of which are hereby incorporated by reference.

This application is a continuation-in-part of U.S. patent Ser. No. 13/700,639, titled ELECTRICAL CONNECTOR INSULATOR HOUSING, filed Jun. 2, 2011, which is a national stage application under 35 U.S.C. § 371 of International Application No. PCT/US2011/038845, titled ELECTRICAL CONNECTOR INSULATOR HOUSING, filed Jun. 2, 2011, which claims priority to U.S. Provisional Application No. 61/351,114, filed Jun. 3, 2010, all of which are hereby incorporated by reference in their entireties.

This application is a continuation-in-part of U.S. patent application Ser. No. 14/238,638, entitled DIRECT METALIZATION OF ELECTRICAL CIRCUIT STRUCTURES, filed Feb. 12, 2014, which is a national stage application under 35 U.S.C. § 371 of International Application No. PCT/US2012/053848, titled DIRECT METALIZATION OF ELECTRICAL CIRCUIT STRUCTURES, filed Sep. 6, 2012, which claims priority to U.S. Provisional Application No. 61/532,379, filed Sep. 8, 2011, all of which are hereby incorporated by reference in their entireties.

This application is a continuation-in-part of U.S. patent application Ser. No. 14/408,205, entitled HYBRID PRINTED CIRCUIT ASSEMBLY WITH LOW DENSITY MAIN CORE AND EMBEDDED HIGH DENSITY CIRCUIT REGION, filed Dec. 15, 2014, which is a national stage application under 35 U.S.C. § 371 of International Application No. PCT/US2013/30856, titled HYBRID PRINTED CIRCUIT ASSEMBLY WITH LOW DENSITY MAIN CORE AND EMBEDDED HIGH DENSITY CIRCUIT REGION, filed Mar. 13, 2013, which claims priority to U.S. Provisional Application No. 61/669,884, filed Jul. 10, 2012, all of which are hereby incorporated by reference in their entireties.

This application is a continuation-in-part of U.S. patent application Ser. No. 14/408,039, entitled HIGH SPEED CIRCUIT ASSEMBLY WITH INTEGRAL TERMINAL AND MATING BIAS LOADING ELECTRICAL CONNECTOR ASSEMBLY, filed Dec. 15, 2014, which is a national stage application under 35 U.S.C. § 371 of International Application No. PCT/US2013/30981, titled HIGH SPEED CIRCUIT ASSEMBLY WITH INTEGRAL TERMINAL AND MATING BIAS LOADING ELECTRICAL CONNECTOR ASSEMBLY, filed Mar. 13, 2013, which claims priority to U.S. Provisional Application No. 61/669,893, filed Jul. 10, 2012, all of which are hereby incorporated by reference in their entireties.

TECHNICAL FIELD

The present disclosure relates to a multi-layered high performance electrical circuit structure constructed using a liquid crystal polymer ("LCP") dielectric material, and a corresponding methods that merge processes for printed circuit boards ("PCB") and semiconductor processing.

BACKGROUND OF THE INVENTION

As semiconductor and electronics markets have progressed, several technical factors have emerged that have significant impact to the electrical interconnects for "systems" whether they be computer, handset, tablet, automotive, medical, telecomm, data centers. Extreme increases in data traffic driven by internet, streaming video, smart phone, tablet and cloud computing are driving need for significant increases in bandwidth. Increases in data rate and functionality are driving significant wide scale architecture evolution. Advances in semiconductor packaging are driving significant density and routing challenges. Power and thermal management are challenges with low voltage systems to preserve battery life. Advances in semiconductor geometries have outpaced printed circuit geometries.

Traditional printed circuits are often constructed in what is commonly called rigid or flexible formats. The rigid versions are used in nearly every electronic system, where the printed circuit board (PCB) is essentially a laminate of materials and circuits that when built is relatively stiff or rigid and cannot be bent significantly without damage.

Flexible circuits have become very popular in many applications where the ability to bend the circuit to connect one member of a system to another has some benefit. These flexible circuits are made in a very similar fashion as rigid PCB's, where layers of circuitry and dielectric materials are laminated. The main difference is the material set used for construction. Typical flexible circuits start with a polymer film that is clad, laminated, or deposited with copper. A photolithography image with the desired circuitry geometry is printed onto the copper, and the polymer film is etched to remove the unwanted copper.

Flexible circuits are processed similar to that of rigid PCB's with a series of imaging, masking, drilling, via creation, plating, and trimming steps. The resulting circuit can be bent, without damaging the copper circuitry. Flexible circuits are solderable, and can have devices attached to provide some desired function. The materials used to make flexible circuits can be used in high frequency applications where the material set and design features can often provide better electrical performance than a comparable rigid circuit. Flexible circuits are very commonly used in many electronic systems such as notebook computers, medical devices, displays, handheld devices, autos, aircraft and many others.

Flexible circuits are connected to electrical system in a variety of ways. In most cases, a portion of the circuitry is exposed to create a connection point. Once exposed, the circuitry can be connected to another circuit or component by soldering, conductive adhesive, thermo-sonic welding, pressure or a mechanical connector. In general, the terminals are located on an end of the flexible circuit, where edge traces are exposed or in some cases an area array of terminals are exposed. Often there is some sort of mechanical enhancement at or near the connection to prevent the joints from being disconnected during use or flexure.

In general, flexible circuits are expensive compared to some rigid PCB products. Flexible circuits also have some limitations regarding layer count or feature registration, and are therefore generally only used for small or elongated applications.

Rigid PCBs and package substrates experience challenges as the feature sizes and line spacing are reduced to achieve further miniaturization and increased circuit density. The use of laser ablation has become increasingly used to create via structures for fine line or fine pitch structures. The use of lasers allows localized structure creation, where the processed circuits are plated together to create via connections from one layer to another. As density increases, however, laser processed via structures can experience significant taper, carbon contamination, layer-to-layer shorting during the plating process due to registration issues, and high resistance interconnections that may be prone to result in reliability issues. The challenge of making fine line PCBs often relates to the difficulty in creating very small or blind and buried vias.

The printed circuit industry has been driven by the mobile and handset market to achieve finer lines and spaces with higher density. The domestic circuit market has adopted laser direct imaging systems and laser drilled micro-vias over the last several years as advancements in fabrication techniques. In general, domestic suppliers can supply 75 micron lines and spaces with multi-layer construction, with the availability of 50 micron lines and spaces in some cases. The supplier pool is dramatically reduced below 50 micron lines and spaces, with blind and buried vias likely required.

Material sets available to traditional fabrication combined with the line and space capabilities drive the overall stack up for impedance control. For high speed applications, loss associated with glass weave and solder mask are an issue, and conventional via technology has become a major source of impedance mismatch and signal parasitic effects.

In general, signal integrity, high aspect ratio vias and line and space requirements limit the relationship between semiconductor packaging and the printed circuit board the chips are mounted to. Whether the application is a multi-layer rigid PCB, a flex circuit, or rigid flex there is a need for a high speed high density alternative.

BRIEF SUMMARY OF THE INVENTION

The present disclosure uses a liquid crystal polymer ("LCP") material as a circuit bearing dielectric material. The LCP can be used in several forms, such as a cast film, an injection molded coupon or wafer as well as in liquid resin form or a composite liquid material that includes LCP particles.

The present disclosure is directed to creating a circuit architecture that uses LCP material in ways that can be processed with the same equipment used to produce conventional circuits, as well as the laser system HSIO uses to produce connector and socket products. LCP has properties that make it ideal for high speed circuit fabrication. LCP have a low dielectric constant of 2.9 and is virtually impermeable to moisture. The ablation point is well suited for UV laser processing, and it has the unique availability of multiple melting temperatures. The present disclosure leverages those properties to create a method of creating circuits where the LCP material can either be pre-clad with copper or processed to accept electro-less copper deposition and fusion bonded using conventional lamination techniques.

In one embodiment, a series of films that have pre-formed or deposited conductor materials contained within the film are provided. The films are located and registered to each other and laminated under heat and pressure. The resulting circuit structure is created and the LCP material is fused together to make a contiguous LCP matrix with corresponding interconnect either held together by the fused LCP or a combination of localized molecular bonding of the conductive material such as copper.

In another embodiment, a circuit landscape is created by etched copper traces. A plating resist is applied and imaged to create via locations that are plated with electrolytic copper. After striping the resist the resultant field of vias is flooded with LCP resin or an alternate material loaded with LCP particles such that a lamination cycle the LCP material fuses. These two embodiments can be used alone or in combination.

The nature of the present process provides the potential for significant enhancement to traditional circuit techniques not generally possible with the normal circuit fabrication process alone. By combining methods used in the PCB fab and semiconductor packaging industries, the present disclosure enables fine line high density circuit structures not currently produced with attractive cost of manufacture. In addition, the high density circuit can be treated as a system of its own by incorporating printed transistors or other passive and active function.

The present disclosure permits the creation of circuit structures with lines and spaces below 50 micron, and preferably below 20 microns, and supports signal integrity beyond 40 GHz. The material sets can be processed with conventional circuit fabrication techniques and equipment. The solid metal vias provide superior electrical performance over conventional barrel plated or micro vias. The present disclosure is applicable to rigid, flexible and rigid flex circuits, as well as semiconductor packaging.

The present disclosure permits bulk conductive material to be added to create a very small low resistance vias to increase density and reduce line and feature pitch of the high density circuit. The printed circuit can be produced to replicate a traditional circuit, or it can be an interconnect to one or more members of a system embedded or incorporated.

One embodiment is directed to a method of making a multilayered, fusion bonded circuit structure. A first circuitry layer is attached to a first major surface of a first LCP substrate. A plurality of first recesses are formed that extend from a second major surface of the first substrate to the first circuitry layer. The first recesses are then plated to form a plurality of first conductive pillars of solid metal that substantially fill the first recesses. A plurality of second recesses are formed in a second LCP substrate corresponding to a plurality of the first conductive pillars. The second recess are plated to form a plurality of second conductive structures that extend between first and second major surfaces of the second substrate. The second major surface of the first substrate is positioned adjacent to the second major surface of the second substrate. The first conductive pillars are aligned with the second conductive structures. The stack is then fusion bonded to mechanically couple the first conductive pillars to the second conductive structures.

BRIEF DESCRIPTION OF THE SEVERAL VIEWS OF THE DRAWING

FIG. 3 is a side-sectional view of a discrete layer to be added to the high density circuit structure of FIG. 2 in accordance with an embodiment of the present disclosure.

FIG. 4 is a side-sectional view of the discrete layer of FIG. 3 fused to the high density circuit structure in accordance with an embodiment of the present disclosure.

FIG. 5 is a side-sectional view of an alternate discrete layer to be added to the high density circuit structure in accordance with an embodiment of the present disclosure.

FIG. 6 is a side-sectional view of the discrete layer of FIG. 5 fused to the high density circuit structure in accordance with an embodiment of the present disclosure.

FIG. 7 is a side-sectional view of an alternate discrete layer to be added to the high density circuit structure in accordance with an embodiment of the present disclosure.

FIG. 8 is a side-sectional view of the discrete layer of FIG. 5 fused to the high density circuit structure in accordance with an embodiment of the present disclosure.

FIG. 12 illustrates an electrical interconnect interfaced with a BGA device in accordance with an embodiment of the present disclosure.

FIG. 13 illustrates an electrical interconnect for a flexible circuit in accordance with an embodiment of the present disclosure.

FIG. 14 illustrates an electrical interconnect for an IC package in accordance with an embodiment of the present disclosure.

FIG. 15 illustrates an alternate electrical circuit for an IC package in accordance with an embodiment of the present disclosure.

FIGS. 16A and 16B are top and side views of a plurality of high density circuit structures combined with a low density PCB in accordance with an embodiment of the present disclosure.

FIG. 16C is a side view of the PCB merged with the high density circuit structures in accordance with an embodiment of the present disclosure.

FIGS. 17A-17G are side sectional views of an alternate method of constructing an alternate high density circuit structure in accordance with an embodiment of the present disclosure.

FIGS. 18A-18D are side sectional views of another alternate method of constructing an alternate high density circuit structure in accordance with an embodiment of the present disclosure.

FIG. 19 is a side sectional view of a method of fusion bonding a plurality of circuit layers in accordance with an embodiment of the present disclosure.

DETAILED DESCRIPTION OF THE INVENTION

The present high density circuit structure can be configured as a low cost, high signal performance electrical interconnect assembly, which has a low profile that is particularly useful for desktop and mobile PC applications. In another embodiment, the high density circuit structure can also be a portion of a socket or semiconductor package.

Figure 1:
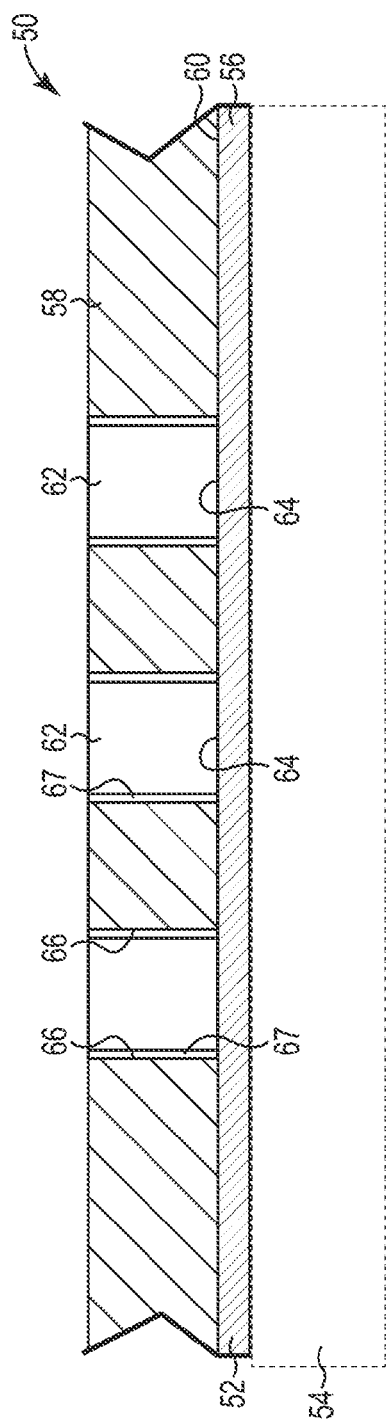
FIG. 1 is a side-sectional view of a method of making a high density circuit structure in accordance with an embodiment of the present disclosure.

FIG. 1 is a side cross-sectional view of a method of making the circuit structure 50 in accordance with an embodiment of the present disclosure. A copper foil 52 is preferably supported by base layer 54. The base layer 54 can be a sacrificial member that is removed at some point later in the process.

If the end product is a flexible circuit, the base layer 54 can be a material such as polyimide or liquid crystal polymer. If the final product is a rigid circuit board, the base layer 54 can be FR4 or one of many high speed laminates or substrates. If the final product is a semiconductor package, the base layer 54 can be a material such as FR4, BT resin of any one of a variety of laminate or substrate materials. In the illustrated embodiment, the copper foil 52 can be pre-formed circuitry layer 56 or can be formed using a fine line imaging step to etch copper foil as is done with many PCB processes. The circuitry layer 56 can include fine line etching with spacing between copper traces of about 25 microns. It will be appreciated that conventional copper etching may be used to pattern thicker copper sheets (e.g., ¼ ounce to ½ ounce), followed by fusion bonding of layers as discussed herein.

Liquid crystal polymer ("LCP") 58 is applied to surface 60 such that the circuitry 56 is at least partially in contact with the LCP 58. The LCP layer 58 may be a film or a liquid. The LCP layer 58 can be applied by screen printing, stencil printing, jetting, flooding, spraying etc. The LCP material is then imaged to create the recesses or vias 62 that expose the circuit locations 64. One benefit of imaging the LCP 58 is that the vias 62 do not need to be round as with traditional drilled vias. Any shape that can be imaged and will result in a grown full metal via 68 of the desired shape. Alternatively, the recesses or vias 62 can be formed using a laser direct imaging process known as LDI.

Liquid crystal polymers are a class of aromatic polyester polymers that are extremely unreactive and inert so as to be useful for electrical applications. Liquid-crystal polymers are available in melted/liquid or solid form. In solid form the main example of lyotropic LCPs is the commercial aramid known as Kevlar. In a similar way, several series of thermotropic LCPs have been commercially produced by several companies (e.g., Vectran/Ticona). LCP materials have a dielectric constant of about 2.9 at a frequency of about 20 GHz, a co-efficient of thermal expansion of about 8 to about 17 ppm/degree C., and a dimensional stability of less than about 0.1%.

In one embodiment, the core LCP material 58 is processed to enable electro-less copper plating to adhere to the side walls 66 of the recesses 62, such as by using one or more of plasma treatment, permanganate, carbon treatment, impregnating copper nano-particles to activate the surfaces 66 to promote electroplating. The electro-less copper plating applied to the side walls 66 creates conductive structures 67 that are electrically coupled to the circuit layer 56. Additional discussion of the use of electro-less plating of the dielectric structure is disclosed in Ser. No. 14/238,638, filed Feb. 12, 2014, and entitled DIRECT METALIZATION OF ELECTRICAL CIRCUIT STRUCTURES, the entire of disclosure of which is hereby incorporated by reference.

Figure 2:
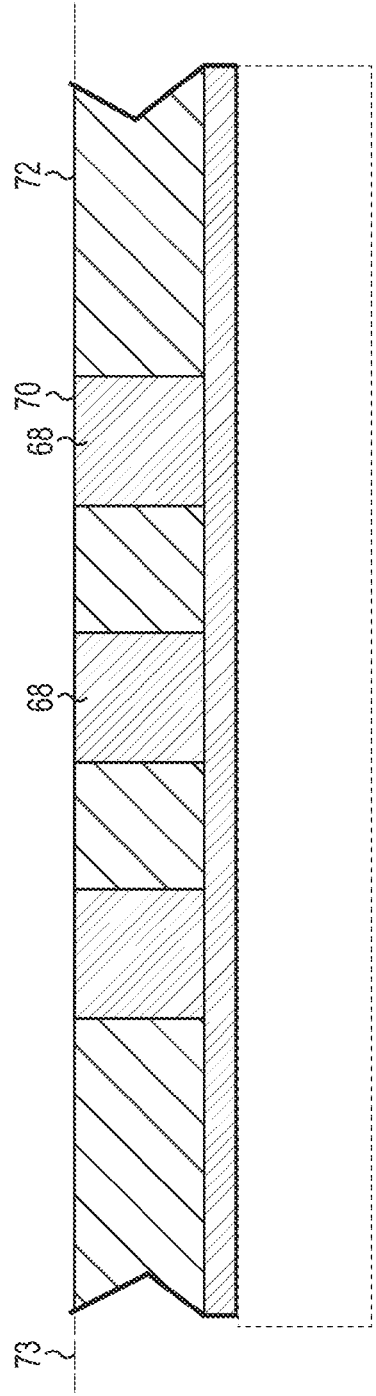
FIG. 2 is a side-sectional view of the high density circuit structure of FIG. 1 with a full metal via in accordance with an embodiment of the present disclosure.

As illustrated in FIG. 2, higher deposition rate electroplate copper can be used to fill the recess 62 with bulk copper to grow a full metal, solid copper pillar or via structure 68 within the recesses 62. The conductivity of the bulk copper pillar 68 is on the order of about $1.68 \times 10^{-6}$ ohm-cm. Additional discussion of the full metal, solid copper pillars is found in Ser. No. 13/413,724, entitled Copper Pillar Full Metal Via Electrical Circuit Structure filed Mar. 7, 2012, which is hereby incorporated by reference.

In another embodiment, the circuitry layer 56 is used to electroplate the circuit locations 64. The copper plating 68 adheres primarily to the base copper 58 at the locations 64. The LCP 58 and base layer 54 act as a resist to prevent copper plating except in the recesses 62. The resulting copper pillar 68 is preferably a solid copper structure, without voids.

The plating process can be controlled to a certain degree, but in some cases with fine pitch geometries and high speed circuits, the upper surfaces 70 of the copper pillars 68 may vary in topography or height relative to the exposed surface 72 of the LCP. Also, the LCP may vary in thickness slightly especially if liquid material is used. The copper pillars 68 are preferably planarized and the thickness of the LCP controlled between steps if needed to create a controlled dimension and flat reference plane 73 for the subsequent processing steps and layers.

For higher aspect ratio via connections 68, the process can be performed in a number of steps. For example, another layer of LCP 58 can be applied and imaged to expose the upper surfaces 70 of the previous copper pillars 68, with the next plating step increasing the height of the copper pillar 68 incrementally. Planarization is preferably performed between each layer.

FIG. 3 illustrates another embodiment for creating higher aspect ratio via connections. Discrete LCP layer 80 is imaged and plated to create an array of copper pillars 82, as discussed herein. The layer 80 is then registered so the lower surfaces 86 of the copper pillars 82 are aligned with the upper surfaces 70 of the copper pillars 68. The stack 84 is then fusion bonded using heat and pressure 74.

As best illustrated in FIG. 4, upper surfaces 70 of the copper pillars 68 are held in intimate contact with lower surfaces 86 of the copper pillars 82 by the fusion bond 90 of the LCP layers 58, 80. This mechanical connection can be augmented by the addition of a deformable conductive material, such as a conductive paste, located at interface 83 of the surfaces 70, 86.

FIG. 5 illustrate an alternate discrete LCP layer 100 with barrel plated vias 102 to form conductive structure 104 in accordance with an embodiment of the present disclosure. The conductive structures 104 are registered and aligned with the copper pillars 68. The stack 106 is then fusion bonded using heat and pressure as discussed herein.

As illustrated in FIG. 6, the copper pillars 68 are held in intimate contact with lower surfaces 108 of the copper structures 104 by the fusion bond 110 of the LCP layers 58, 100. In one embodiment, the vias 102 are then filled with bulk copper plating after the fusion bonding step to create the solid metal pillar 69 generally shown in FIG. 4. The plating bonds directly to the upper surfaces 70 of the copper pillars 68, as well as the exposed surfaces of the conductive structures 104 in the layer 100, resulting in a mechanical and electrical connection between the copper pillars 68 and the conductive structures 104.

FIGS. 7 and 8 illustrate another variation of the embodiment of FIGS. 5 and 6 in which the vias 62, 102 on both layers 58 and 100 are barrel plated. The subsequent bulk copper pillar extends between the layers 58, 100 across the plane of the fusion bond 110 to create the solid metal pillar 69 generally illustrated in FIG. 4.

Figure 9:
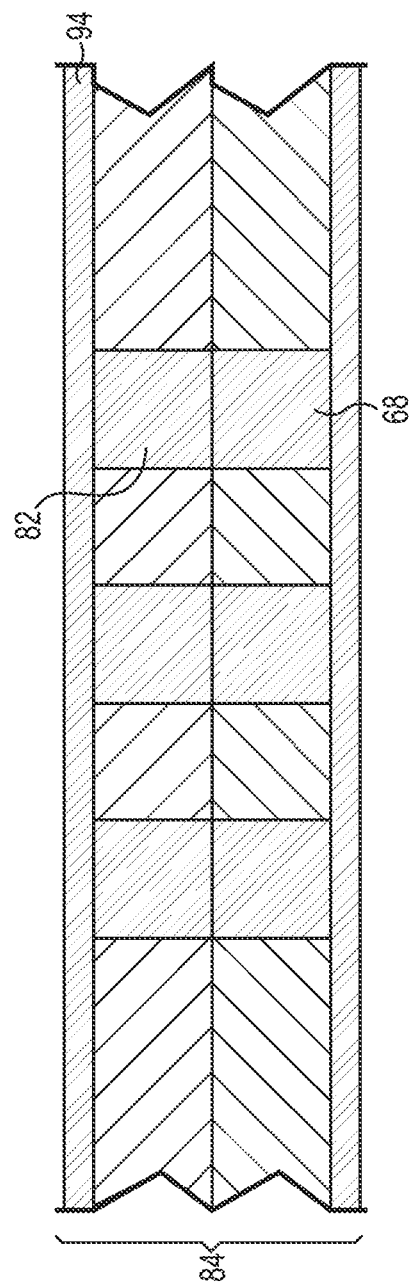
FIG. 9 is a side-sectional view of a circuitry layer added to the high density circuit structure of FIG. 4 in accordance with an embodiment of the present disclosure.

FIG. 9 illustrates an optional copper layer 94 added to create the base for additional routing layers and to facilitate vertical via connection to subsequent layers in the stack 84. The present process creates the ability to stack full metal vias 68, 82 in subsequent deposition steps and/or layers to create a high aspect ratio via without the need to drill through the entire stack in one operation.

Figure 10:
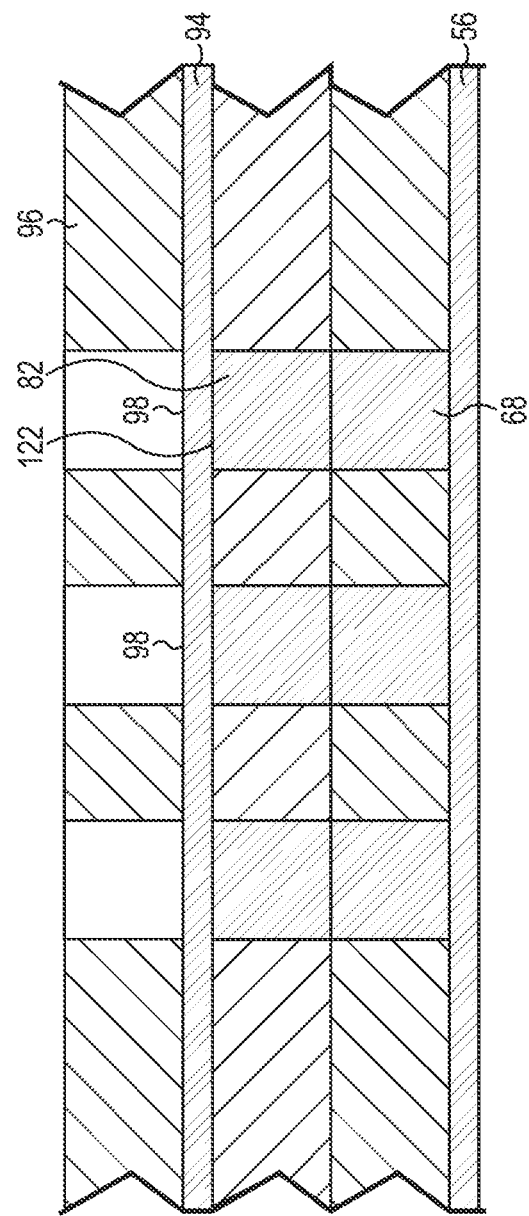
FIG. 10 is a side-sectional view of a dielectric layer added to the high density circuit structure of FIG. 9 in accordance with an embodiment of the present disclosure.

As illustrated in FIG. 10, resist layer 96 can be added to the subsequent copper foil 94 and imaged to expose circuit locations 98. The LCP 96 flows and fills any recessed regions within a previous circuit landscape 94. The present process can also be used in combination with existing dry film techniques. For example, one or more of the layers can be a preformed dielectric film to leave air dielectric gaps between traces in the circuit layer 94.

In the illustrated embodiment, the circuit locations 98 are electrically coupled with the tops surfaces 122 of the pillars 82 and connect to the circuit layer 94. The resist layer 96 protects circuit layers 56, 94 that are not to be etched and provides contact points to the previous pillar 68, 82.

Figure 11:
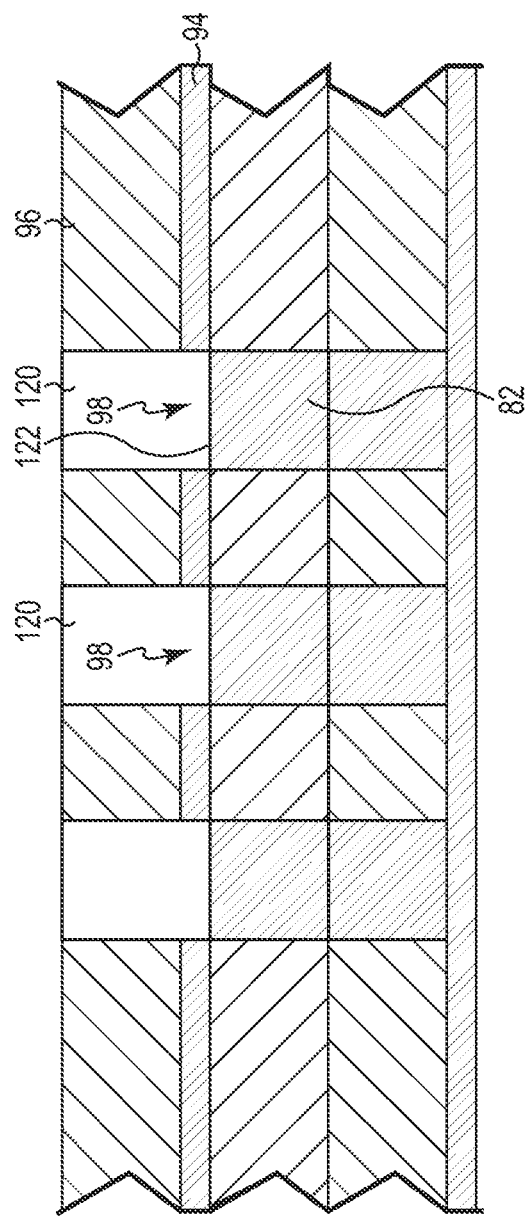
FIG. 11 is a side-sectional view of a modification to the circuitry layer of FIG. 10 in accordance with an embodiment of the present disclosure.

FIG. 11 illustrates a subsequent etch process that removes the copper foil 94 at the locations 98 in the recesses 120 to provide access to top surfaces 122 of the pillars 82 to allow access for the next plating step to join the layers together in accordance with an alternate embodiment of the present disclosure. Depending on the material 96 and the desired final construction, the layer 96 can be stripped to provide a level to be planarized as the base for subsequent layers or the layer 96 can be left in place.

As illustrated in FIG. 12, the recesses 120 can optionally be filled with similar LCP material 130, followed by a planarization step. A circuitry layer 138 is then added to the planarized surface 139. The stack 84 can be further processed with conventional circuit fabrication processes to add larger diameter through vias or through holes 132 with optional plating 134 as needed.

A solder mask 136 can be applied on circuitry layer 138 and imaged to expose device termination locations 140. The solder mask 136 can also be laser direct imaging. In one embodiment, the solder mask 136 is a LCP. The locations 140 are configured to correspond to solder balls 142 on BGA device 144. In the illustrated embodiment, bottom dielectric layer 146 is optionally deposited on circuitry layer 56 in a manner to expose selective regions 147.

As illustrated in FIG. 13, for flexible circuit applications the stack 84 is laminated with ground planes, cover layers, final finish 148, 150. In some applications the insulating areas can be applied by jet printing of polyimide or LCP as a final layer or as a combination of laminated film and jetted material.

FIG. 14 illustrates an embodiment for semiconductor packaging applications in accordance with an embodiment of the present disclosure. The stack 152 can be final processed with a variety of options to facilitate attachment of dies 162, 166, 172, as well as system level attachment to a PCB 154.

In one embodiment, the pillar 160 is planarized to facilitate flip chip attach to the structure directly (see e.g., FIG. 2) or to receive BGA device 162. In another embodiment, plating 164 is extended to facilitate direct soldering of IC device die 166 with paste. In yet another embodiment, plating 168 is wire bonded 170 to the IC device 172.

On the system interconnect side the structure can be processed to accept a traditional ball grid array attachment 182 for an area array configuration or plated with solder/tin etc. for a no lead peripheral termination. The structure can also be fashioned to have pillar or post extensions 184 to facilitate direct solder attach with paste and to provide a natural standoff.

FIG. 15 illustrates an electrical circuit 200 for a semiconductor packages 202 with LCP dielectric materials 204 surrounding the vias, internal circuits, terminations, and conductive structures 206 in accordance with an embodiment of the present disclosure. Internal circuits and terminations may also be added by imaging or drilling the core material with a larger opening than needed and filling those openings with an LCP material and imaging the desired geometry to facilitate conductive structure formation.

FIGS. 16A and 16B schematically illustrate the merger of a lower density circuit 220 with one or more liquid crystal polymer circuit structures 222A, 222B, 222C, 222D ("222") into the contiguous assembly of FIG. 1C. The lower density circuit 220 may be a printed circuit board, a flexible circuit, or the like. The circuit structure 222 can be coupon or wafer configured as an IC socket, a semiconductor package, or the like.

Dielectric material 224, such as a LCP, is optionally applied to the surface 226 of the low density circuit 220 so the location of the high density circuits 222 is at least partially defined and isolated. The dielectric material 224 may be a film or a liquid dielectric, such as a liquid crystal polymer. The dielectric material 224 can be a preformed structure or printed to expose the circuit locations 228 for the high density circuits 222, improving alignment of vias on the lower density main core 220 with the high density circuits 222. In embodiments where the surface 226 includes a LCP, the LCP circuit structures 222 can be bonded using heat and pressure, as discussed herein.

If the circuit assembly 230 is a flexible circuit, the base layer can be a material such as polyimide or liquid crystal polymer. If the circuit assembly 230 is a rigid circuit board, the base can be FR4 or one of many high speed laminates or substrates. If the circuit assembly 230 is a semiconductor package, the base can be a material such as FR4, BT resin of any one of a variety of laminate or substrate materials. If the circuit assembly 230 is an electrical connector or socket, the base can be molded LCP, machined plastic, or a variety of films or substrate materials.

The liquid crystal polymer circuit structures 222 (also referred to as "coupons") are preferably made using the process described below. The liquid crystal polymer circuit structures 222 are then optionally merged with the low density circuit 220. In another embodiment, the liquid crystal polymer circuit structures 222 can be fabricated in-situ directly on the low density circuit 220 using the processes described herein. The present method permits the liquid crystal polymer circuit structures 222 to be formed directly in the circuit locations 228, without having to extend the processing across the entire low density circuit 220.

FIGS. 17A-17G illustrate an alternate method of making a circuit structure 250 using a LCP dielectric material 252 in accordance with an embodiment of the present disclosure. The LCP material 252 provides enhanced electrical performance, reduces the overall thickness 254 of the circuit structure 250. The resulting circuit structures can have 1/10 the thickness of a conventional PCB with comparable features.

Base layer 252 has a thickness of about 0.002 inches and is coated with ¼ ounce copper layer 258. The copper layer 258 can be etched using conventional techniques to create the desired circuitry layer. The base layer 252 can optionally have copper foil located on both sides. In another embodiment, the base layer 252 can be a bare sheet of LCP that is processed to accept electro-less.

In one embodiment, the LCP layer 260 is clad with 3 micron thick copper on the top surface. The laser ablation used to create vias 262 penetrates the 3 micron thick copper and the LCP 260 without damaging the base copper layer 258. In an alternate embodiment, a top copper layer is electro-lessly plated onto the LCP layer 260 during a subsequent operation. Additional flash copper plate can be added to increase the thickness of the copper layer 268 as needed.

LCP layer 260 is located on the circuitry layer 258. Laser ablation is used to create via 262, without damaging the circuit structure 264 at the base of via 262. The vias 262 preferably has a diameter of about 0.0005 inches to about 0.005 inches. The vias 262 preferably have an aspect ratio (height: diameter) of about 2:1 to about 1:1.

As shown in FIG. 17B, electroplating is used to fill the opening 262 with solid copper 266 using the copper 258 as the electroplating buss. The full metal via 266 is electroplated up to surface 268. Over-plate can be removed using planarization techniques.

The present method permits the creation of solid or nearly solid filled, blind, or buried via 266 on very tight pitch of 25 micron or below. The LCP process permits via stacks that are 50 micron, 100 micron, and 150 micron high, about 25 times shorter than conventional PCB. The nature of the dielectric application and imaging structure allows for variable material content by position, by layer, and within various points on a given layer. The stack may be partly or completely produced digitally without tooling. Terminal shapes can be created in a variety of geometries depending on the terminal connected. Multiple interface points can be implemented to provide increased reliability or lower contact resistance. Electrical enhancements can include internal intelligence, test functions, data storage, shielding, RF antennae, power or signal management, capacitive coupling, analog to digital conversion, decoupling, Led indicators, display functions, battery capability, and the like.

As shown in FIG. 17C, upper surface 268 of the LCP layer 260 is electro-less plated to create seed layer 270 for signal pad and ground plane bulk electrolytic build-up plating. The seed copper layer 270 can be removed with differential etch process, leaving the desired circuit pattern intact.

Figure 17D:
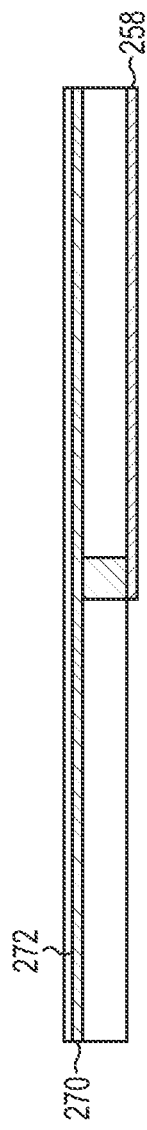

FIG. 17D shows an embodiment in which resist layer 272 is applied to copper layer 270. The resist layer 272 is imaged to define the circuit pattern. The circuit pattern is electroplated restricted by the resist layer 272. In one embodiment, the circuit pattern and the vias 266 are plated at the same time.

Also illustrated in FIG. 17D, the copper layer 258 is processed to create the desired circuit structure using conventional techniques. The circuit structure in the layer 258 is bulk plated as needed.

Figure 17E:
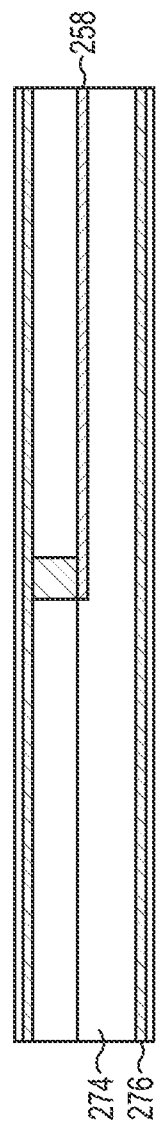

As shown in FIG. 17E, LCP layer 274 is applied to exposed lower circuit layer 258. One of the beneficial properties of the LCP material is it is available in multiple melting temperatures. A lower melt temperature LCP is used to level the circuit patterns with a fusion bonding process that fills in the regions between the circuit structures 258, as well as serves as the bonding agent for the next LCP layer as needed. The resulting structure has many advantages with solid copper full metal vias and traces that are surrounded by LCP with a common dielectric constant. The LCP material can also act as solder mask which is a significant benefit for high speed signals since solder mask is a lossy material. In the illustrated embodiment, LCP layer 274 also includes circuitry layer 276.

FIG. 17F illustrates the formation of through holes or vias 278 drilled in the circuit structure 250. Plating 280 is added to the vias 278 to electrically couple the circuitry layers 270 and 276. As illustrated in FIG. 17G, final finish and solder mask operations are then performed to create a LCP based circuit stack 250 that represents a thinner higher performance replica of a conventional circuit structure.

The present processing encompasses many variations depending on the intended design and results can be used directly as a flexible circuit or a rigid flex with a bonded stiffening member as appropriate. Multi-layer constructions with blind and buried vias basically combine layer stacks with some limitations regarding sequential build up with stacked vias. More complicated multi-layer constructions are also possible. The first uses the LCP layers for the fine lines and signal integrity, while the center region is a conventional rigid PCB constructed using conventional methods. A second method is a mother board—daughter card approach where the high density regions are fabricated with the LCP circuit stack and then merged with a larger format board built with conventional construction.

Figure 18A:
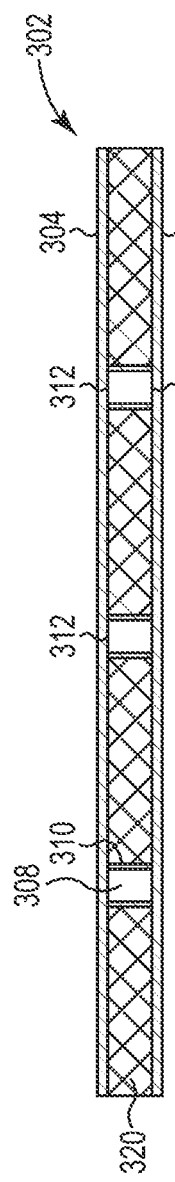
Figure 18B:
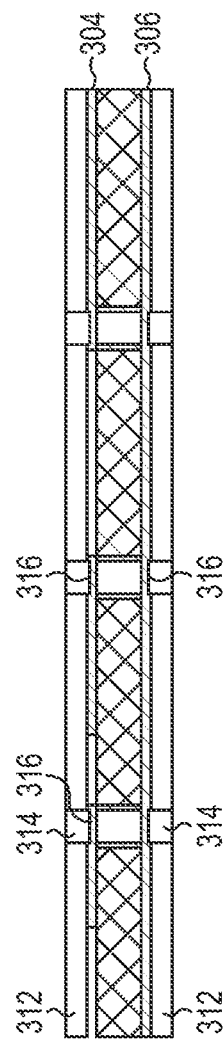
Figure 18C:
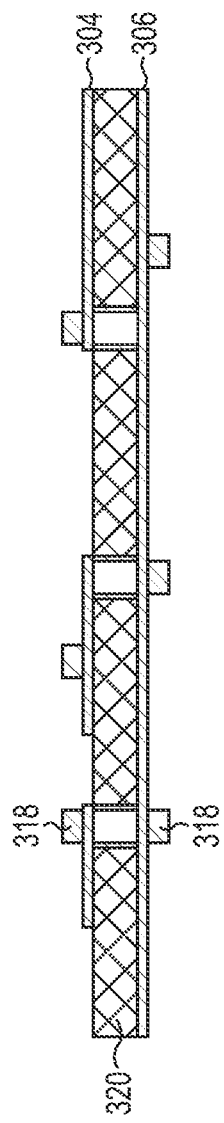

FIGS. 18A-18C illustrate alternate circuit structure 300 built using LCP layers 320 in accordance with an embodiment of the present disclosure. The illustrated embodiment is a 12-layer PCB is assembled with three lamination cycles.

FIG. 18A illustrates a center core 302 that is about 0.021 inches thick with a copper layer 304, 306 about 18 micron thick on the opposite surfaces. Vias 308 about 0.001 inches to about 0.004 inches in diameter are laser drilled through the center core 302. The vias 308 are barrel plated to add plating layer 310. The vias 308 are then filled with a conductive or non-conductive material and cap plated 312.

As illustrated in FIG. 18B, power and ground circuitry are imaged in the copper layers 304, 306 and partial etched to leave about 3 microns of background copper between the traces to act as electrolytic plating buss. Resists layers 312 is applied and imaged to create vias 314 that expose locations 316 in the circuitry layers 304, 306. The vias 314 are plate to create solid metal pillars and/or circuit traces 318 and the resist layers 312 are removed.

Patterning of the resist layer 312 to define pattern plating structures, such as vias 314, with fine definition is accomplished with Laser Direct imaging in either a developed film process or direct ablation of cured resist.

As illustrated in FIG. 18C, the plated vias 314 result in solid copper pillars 318 that extend above the circuitry layers 304, 306. In the illustrated embodiment, the solid copper pillars 318 have diameters of about 0.003 inches. A differential etch is used to remove the 3 micron copper buss discussed above. The resist layer 312 constrains subsequent plating to create solid copper pillars 318 have a fine definition of about 100 micron on about a 300 micron pitch to be used for layer to layer interconnect.

FIG. 18D illustrates upper and lower LCP circuit stack layers 330, 332 created with vias 334 configured to receive the copper pillars 318 on the center core 302. In one embodiment, the vias 334 include barrel plating 335. The layers 330, 332 are created using the process discussed on connection with the center core 302. In particular, the layers 330, 332 are a sheet of LCP 336 about 0.002 inch thick with copper 338, 340 about 3 microns thick on both sides. The vias 334 are laser drilled with a diameter of about 0.003 inches. A resist is applied and patterned so the bottom side signal circuitry 340 can be pattern plated to the proper thickness, the resist is stripped and differential etched to remove background copper. In another embodiment, conventional etching can be used to define circuitry 340.

In an alternate embodiment, one or more of the layers 302, 330, 332 are fabricated using conventional means. For example, the core layer 302 may be a conventional PCB, while the layers 330, 332 are fabricated using the techniques disclosed herein. In another embodiment, the ground and power layers can be located on a conventions circuit structure, with the signal layers located on LCP layers fabricated as discussed herein.

In another embodiment, the LCP film 302 has a thickness of about 1 mils to about 4 mils. Subsequent layers of LCP can be selected with a thickness to achieve impedance targets. By combining various film thicknesses the proper dielectric separation can be achieved.

One or both of the layers 304, 306 are a copper seed layer about 3 microns or less thick, for example, applied using electro-less deposition. A circuit structure including circuit traces and vias is imaged in the resist 312. In one embodiment, the resist 312 is about 1 mils thick. The very thin copper seed layer 304, 306 are used as a base for circuit pattern 318 electrolytic build-up using a resist 312 defined pattern plate technique. The circuit pattern is plated to the top of the resist 312 resulting in circuit traces 318 that are about 28 microns thick. The resist 312 is then stripped and a differential etch process is used to remove unwanted base copper, leaving the circuit patterns 318 intact with nearly vertical sidewalls. The resulting circuit traces 318 are about 25 microns wide, about 25 microns thick, and have a pitch of about 25 microns. Full metal vias with a diameter of about 25 microns to about 50 microns can also be created during this process.

Applicant has determined circuit traces 318 about 25 micron wide with about 25 micron spacing between adjacent traces 318 that are surrounded by about 25 microns of LCP provide almost exactly 50 ohms single ended impedance. Using full metal copper vias with a diameter of about 25 microns results in a very high speed, high dentistry circuit structure.

A fusion bonding process is used to encapsulate the circuit patterns 318 in a manner that provides dielectric separation, leveling of the circuit pattern where spaces between circuits are filled, as well as the bonding mechanism for the next circuit layer. In one embodiment, the LCP covering layer is fusion bonded to the circuit traces 318 (see e.g., LCP film 350 in FIGS. 19 and 402 in FIGS. 22A/22B) with a net dielectric thickness roughly 70-80% of pre-bonding thickness.

The embodiments disclosed herein achieve fine line low loss signal performance beyond 40 GHz. The use of thin sections of LCP material allows for a very tight control of impedance profiles (1-3%) with geometries 318 in the range of about 25 microns, and more preferably, about 10 microns to about 15 microns on rigid, flexible and semi-rigid printed circuits and package substrates. The process results in very well defined fine line circuit patterns with vertical sidewalls that are completely surrounded with a homogenous, near hermetic low dielectric constant material, with solid copper via options providing vertical interconnect.

A final LCP fusion layer is optionally used to complete external circuit layers, with final metal layer exposure for component mounting. The final LCP layer is used in place of conventional solder mask (which is very lossy from a signal integrity standpoint). That is, the final LCP surface acts as the solder mask, providing a high speed path through the circuit all the way to the device terminal. The present embodiment provides increased circuit density at very well defined 15-50 micron lines and spaces and a material set that allows for very tight impedance control (1-3%), 20-75 micron solid copper vertical interconnects, and omission of solder mask with a final circuit stack often much thinner than comparable conventional circuits.

The present embodiment provides a number of benefits. The circuit stack includes solid copper vias grown and stacked along with pattern plate. Internal capture pads are not needed. Drilled and barrel plated through holes can be added as needed, as can solid copper full metal blind and buried vias. The traces and vias are completely surrounded by common dielectric. The stack up is thinner than conventional fabrication, providing better aspect ratios for plating. The final LCP layer acts as solder mask and is optically translucent with circuits visible for alignment.

FIG. 19 illustrate a process for laminating the layers 302, 330, 332 in accordance with an embodiment of the present disclosure. A film 350 of LCP or suitable alternate is pre-drilled with clearance holes 352 and aligned with the solid copper pillar 318 on the top surface of the center core 302 and the plated vias 334 in the upper LCP layer 302. A similar film 354 with pre-drilled holes 356 is aligned with the copper pillars 318 on the bottom of the center core 302 and the plated vias 334 on the lower LCP layer 332. The films 350, 354 are preferably a low melt point LCP material.

The current embodiment is also applicable to a hybrid high density/low density base board structure illustrated in FIGS. 16A-16C. With this design, the lower density PCB 302 is built with conventional technology. The solid copper pillars 318 of the present disclosure are added to the PCB 302 and configured to mate with corresponding vias 334 on the high density LCP circuit structures 330, 332. In this embodiment, the layers 330, 332 correspond with LCP circuit structures 222 in FIG. 16C. The layers 302, 330, 332 are then bonded using heat and/or pressure as discussed herein. A similar example is a probe card or ATE board construction where the high density region in the center of the board is accomplished by merging a daughter card with appropriate routing to fan out the die patterns. Further discussion of such hybrid high density/low density circuit structures is found in PCT/US2013/030856 entitled Hybrid Printed Circuit Assembly with Low Density Main Core and Embedded High density Circuit Regions, filed Mar. 13, 2013, which is hereby incorporated by reference.

The layers 330, 350, 302, 354, 332 are laminated and the LCP layers 350, 354 are fusion bonded to the adjacent layers. The copper pillars 318 are inserted into the plated vias 334 to form a mechanical and an electrical connection. The low melt temperature material in the layers 350, 354 fills the spaces between the traces of the circuitry layers 340, 304, 306 as it semi-flows in the fusion bonding process. The present process eliminates air entrapment that can cause blisters or bubbles during lamination. The process is self-leveling so planarity of the adjacent layers 330, 302, 332 is maintained. Surrounding the circuitry layers 340, 304, 306 in a common dielectric LCP provides a significant benefit from a signal integrity standpoint.

Figure 20:
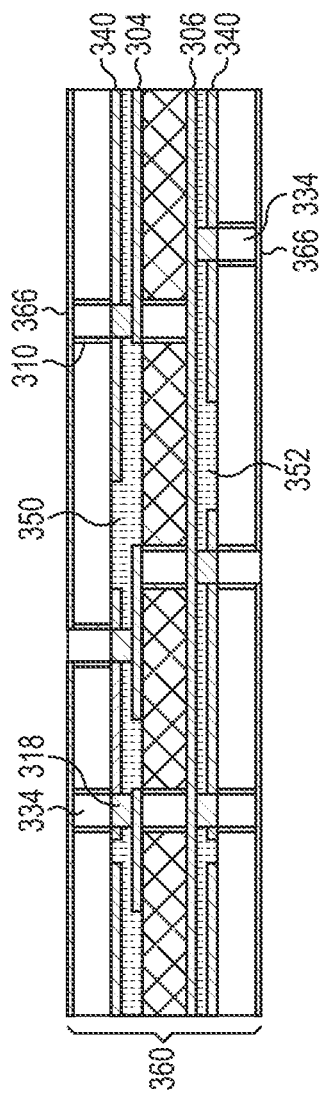
FIG. 20 is a side sectional view illustrated the plurality of circuit layers of FIG. 19 after fusion bonding in accordance with an embodiment of the present disclosure.

As illustrated in FIG. 20, the circuit stack 360 is fused together by the LCP layers 350, 354. Signal integrity is greatly enhanced due to the circuitry 304, 306, 340, the plated vias 310 and the copper pillars 318 being surrounded by a LCP material with a similar dielectric constant.

Figure 21:
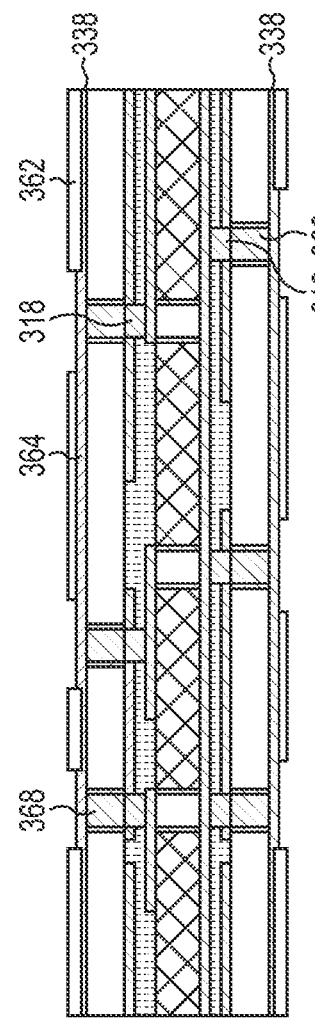
FIG. 21 is a side sectional view of solid metal vias added to the high density circuit structure of FIG. 20 in accordance with an embodiment of the present disclosure.

As illustrated in FIG. 21, the exposed electrolytic copper plating bus 338 is coated with resist 362 and imaged to expose the desired circuitry pattern 364 and to remove any cap plating 366 covering the vias 334 (see FIG. 20).

The outer layer circuitry 364 is pattern plated to the proper thickness. During this plating process the vias 334 are preferably filled with bulk copper 368 that mechanically and electrically couples with the copper pillars 318. In an alternate embodiment, the barrel plating 310 is eliminated in favor of the bulk copper 368 deposited in the vias 334.

Any through holes are drilled and barrel plated as well. Solder mask is applied and final finish and legend print completes the construction. Any via locations that are not 100% filled with copper during the pattern plate operation are typically capped by solder mask.

The present disclosure enables circuit structures that are about 0.008" thick compared to 0.125" thick for the conventional back-drilled construction. The resulting performance is 60% improved over conventional construction beyond 20 GHz with equivalent design rules. Patterning of thin resist to define pattern plating structures with fine definition is accomplished with laser direct imaging in either a developed film process or direct ablation of cured resist. Fine definition of 25 micron traces with 37 micron spaces with base LCP material are possible. Very fine definition of 100 micron copper pillar full metal via formations on 300 micron pitch can be used for layer to layer interconnect.

Other circuit structures to which the present disclosure applies are disclosed in Ser. No. 13/410,943 entitled Area Array Semiconductor Device Package Interconnect Structure with Optional Package-to-Package or Flexible Circuit to Package Connection, filed Mar. 2, 2012; and Ser. No. 13/700,639 entitled Electrical Connector Insulator Housing, filed Nov. 28, 2012, which are hereby incorporated by reference.

Figure 22A:
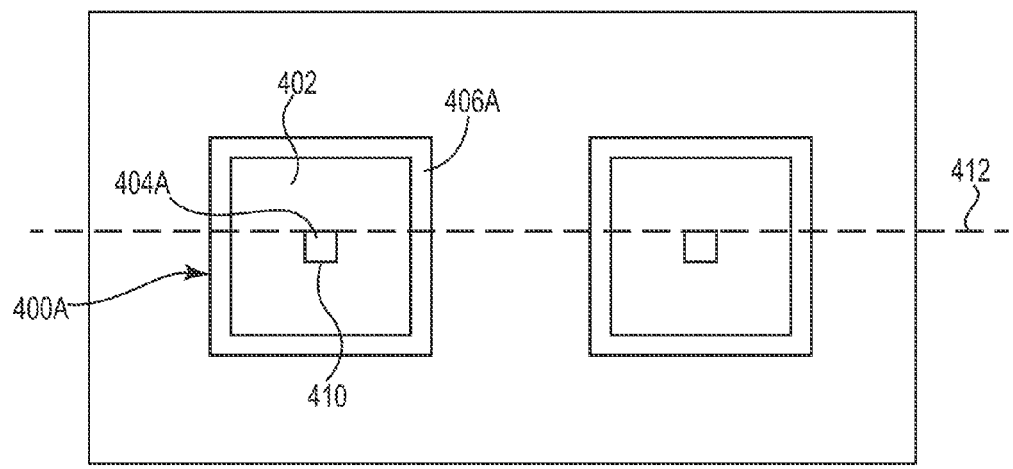
FIGS. 22A and 22B are sectional views of co-axial circuit structures in accordance with an embodiment of the present disclosure.
Figure 22B:
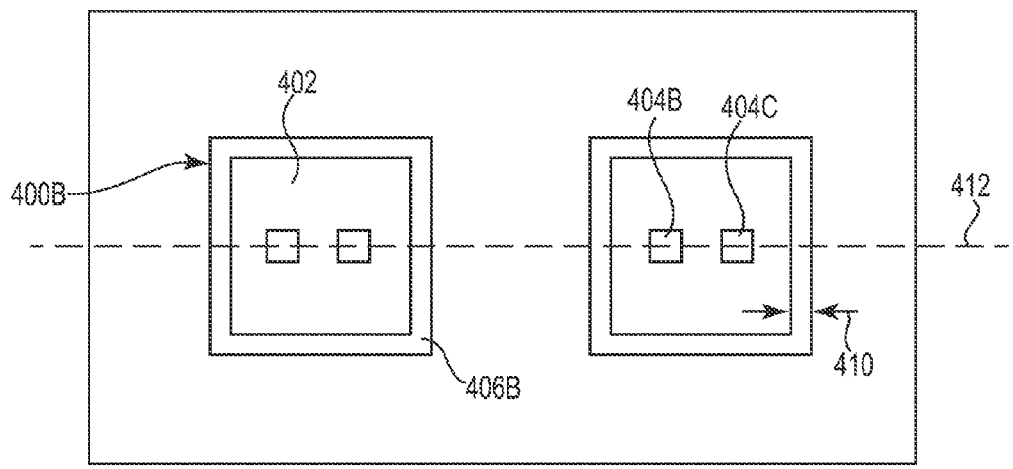

FIGS. 22A and 22B are a sectional view of co-axial structures 400A, 400B embedded in LCP material 402 in accordance with an embodiment of the present disclosure. The center conductors 404A, 404B, 404C ("404") are solid metal structures, preferably with a generally square cross-sectional shape. As discussed above, differential etching of the copper base layer and subsequent plating restrained by an imaged resist layer permits the fabrication of conductive traces with a substantially rectangular cross-sectional shape. Surrounding the center conductors 404 in the LCP material 402 provides greatly enhance signal integrity.

In one embodiment, the center conductors 404 have cross-sectional side dimensions of about 25 micrometers. The center conductors 404B, 404C are preferably separated by about 25 micrometers of LCP material. The co-axial conductors 406A, 406B also preferably have a width 410 of about 25 micrometers and are separated from the center conductors by about 25 micrometers of LCP material.

The center conductors 404 are optionally fabricated by creating a metalized layer 410 on the LCP to permit bulk copper plating to be formed in the channel formed by either a resist or the LCP material, as discussed herein. In one embodiment, the co-axial structures 400 are fabricated as two components that are subsequently fused along bonding lines 412.

Figure 23A:
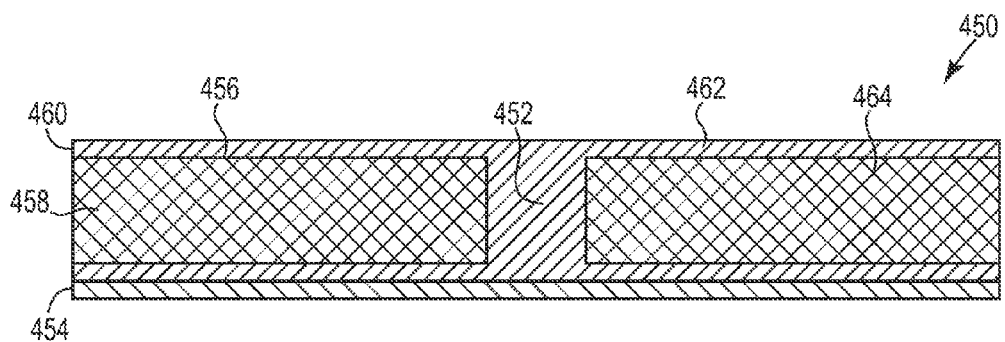
FIGS. 23A-23C illustrate an alternate method of making a circuit structure in accordance with an embodiment of the present disclosure.
Figure 23B:
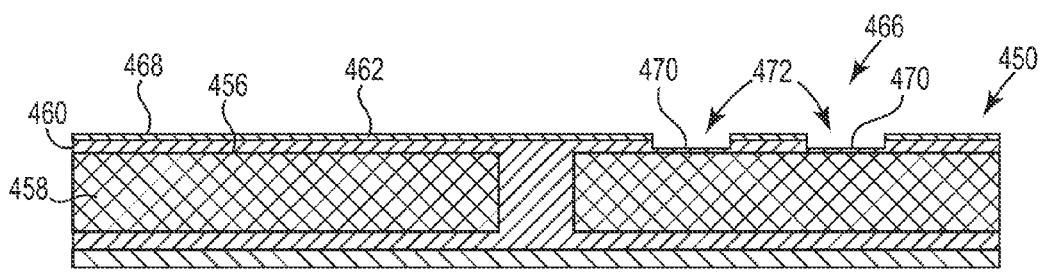
Figure 23C:
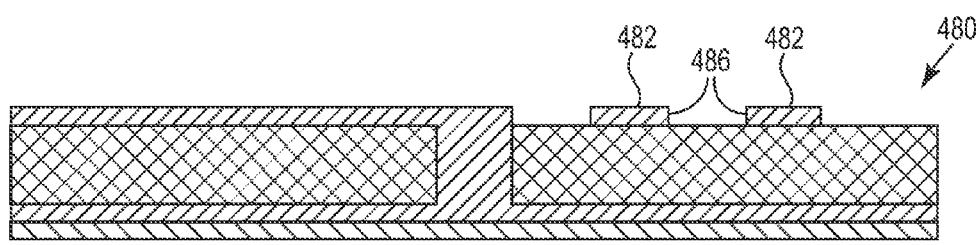

FIGS. 23A-23C illustrate an alternate method of making a circuit structure 450 in accordance with an embodiment of the present disclosure. This embodiment is particularly applicable to creating fine lines and spaces using thicker standard ½ ounce or ¼ ounce thickness copper. FIG. 23A illustrates full metal via 452 extending from base copper layer 454 up to top surface 456 of the LCP 458. Copper layer 460 deposited on top surface 456 of the LCP 458 is thicker than in other embodiments, on the order of about at 0.007 inches thick.

The challenge for normal etching of thicker copper, such as the copper layer 460, is that the resulting circuit traces have a taper or trapezoidal cross-section due to the fact that upper surface 462 of the copper layer 460 etches faster than the lower surface 464. In order to etch down to the top surface 456 of the LCP layer 458, the spacing between adjacent circuit traces is usually larger than the actual trace, limiting the effective line and spacing between traces.

FIG. 23B illustrates a resist pattern 466 created with resist layer 468. In the illustrated embodiment, the resist layer 468 is about 0.005 inches thick. In the preferred embodiment, the image 466 is created using a laser to ablate the resist layer 468 and a portion of the copper layer 460 to just above top surface 456 of the LCP layer 458. Using the laser to ablate the copper layer 460 creates substantially rectangular copper traces 482 (see FIG. 23C). An UV laser vaporizes the resist 468 and the copper 460 without leaving deposits behind. In the present embodiment, a thin layer of copper 470 remains in the recesses 472 to prevent the laser from cutting through the LCP layer 458. In one embodiment, the thin copper 470 is on the order of about 3 microns thick.

Basically, the copper layer 460 is ablated down to a very thin layer 470 at the same time as the resist layer 468 is ablated. This approach allows starting with the thicker copper layer 460 and ablating down to the thin layer 470 using the laser to define the resist pattern 466, as well as give the etching a head start by removing most of the copper 460 that would normally need to be etched away. The present embodiment is able to define a circuit structure 480 (see FIG. 23C) with the resolution and definition of the laser, rather than the resolution of conventional image and develop process used by conventional resist imaging.

After processing with the laser, the circuit structure 450 is etched to remove the remaining copper 470 in the recesses 472. The resist layer 468 protects the upper surface 462 of the copper layer 460 during the etching. The 3 micron copper 470 at the base of the recesses 472 is etched away very quickly during the differential etch, without degrading the remaining circuit pattern excessively.

As illustrated in FIG. 23C, the resist layer 468 has been stripped and the circuit structure 480 remains. The copper 470 at the base of the recesses 472 is also gone. One of the benefits of the present embodiment is that resist ablation and pattern definition is done on the same machine as the full metal via 452 drilling so there is no registration issue as there is with conventional methods where the resist is imaged using a low power source that can expose photo sensitive material, but cannot ablate or vaporizes the resist layer 468 or the copper layer 460. The present method uses the laser to ablate the resist and the copper at the same step (although with a different power setting for copper). The same laser can also be used to drill the vias 452 in the same set-up.

When the fusion bond layer is applied, the space 470 between the traces 482 and any undercut adjacent to the traces 482 created during etching of the thin copper layer 470 are filled with LCP. Additionally, the circuit traces 482 are relatively thick (about 0.0007 inches to about 0.007 inches) with very straight, rectangular side walls 486 and little or no taper. The traces 482 preferably have an aspect ratio (height: diameter) of about 2:1 to about 1:1.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of making, a multilayered, fusion bonded circuit structure comprising the steps of:
    attaching a first circuitry layer to a first major surface of a first liquid crystal polymer (LCP) substrate;
    forming a plurality of first vias extending from a second major surface of the first substrate to the first circuitry layer;
    plating the first vias;
    applying a photo sensitive material to the first circuitry layer;
    imaging the photo sensitive material to create a plurality of first recesses that expose locations on the first circuitry layer;
    plating the first recesses to form a plurality of first conductive pillars of solid metal that substantially fill the first recesses, the first conductive pillars extending above the first major surface of the first substrate;
    forming a plurality of second recesses in a second LCP substrate corresponding to the plurality of the first conductive pillars;
    plating the second recesses to form a plurality of second conductive structures that, extend between first and second major surfaces of the second substrate;
    aligning the first conductive pillars with the second conductive structures;
    positioning distal ends of the first conductive pillars at least partially in the second recesses of the second substrate before the fusion bonding step; and
    fusion bonding the first and second LCP substrates to mechanically and electrically couple the first conductive pillars to the second conductive structures.

2. The method of claim 1 comprising the step of laser drilling the first and second recesses.

3. The method of claim 1 wherein the step of attaching the first circuitry layer to the first major surface of the first LCP substrate comprises the steps of:
    plating the first major surface of the first LCP substrate with a seed layer of a conductive material;
    applying a photo sensitive material to the seed layer of conductive material; and
    forming the plurality of first recesses in the photo sensitive material.

4. The method of claim 3 comprising the steps of:
    bulk plating the first recesses with a conductive material;
    removing the photo sensitive material to reveal substantially rectangular conductive traces; and
    etching the first LCP substrate to remove exposed portions of the seed layer adjacent the conductive traces.

5. The method of claim 1 comprising the step of fusion bonding an LCP material to the first major surface of the first LCP substrate to substantially surround the first circuit layer.

6. The method of claim 1 comprising the step of planarizing the major surfaces of the first and second substrates before the step of fusion bonding.

7. The method of claim 1 comprising the step of plating the second recesses to, form a plurality of second conductive pillars of solid metal.

8. The method of claim 1 wherein the second conductive structures comprise barrel plated vias, the method comprising the steps of plating the barrel plated vias to form a plurality of second conductive pillars of solid metal bonded to the first conductive pillars.

9. The method of claim 1 comprising locating the first conductive pillars on a pitch of less than 150 micrometers.

10. The method of claim 1 wherein the first conductive pillars have a height measured between the first and second major surfaces of less than about 150 micrometers.

11. The method of claim 1 comprising the step of attaching a second circuitry layer to a first major surface of the second substrate.

12. The method of claim 11 comprising the steps of:
    bonding a third layer of LCP to an exposed surface of the second circuitry layer; and
    laser drilling a plurality of vias from an exposed first major surface of the third layer to the second circuitry layer.

13. The method of claim 1 comprising the step of configuring the first conductive pillars to extend above the first major surface of the first substrate.

14. The method of claim 1 comprising the step of plating the second conductive structures after the fusion bonding step to form a plurality of second conductive pillars of solid metal bonded to the first conductive pillars.

15. The method of claim 1 comprising the steps of:
    forming a plurality of through holes corresponding to the first conductive pillars and the second conductive structures in a bond layer of low melt LCP;
    positioning the bond layer between the first and second substrates with the through holes aligned with the first conductive pillars and the second conductive structures before the fusion bonding step; and
    fusion bonding the bond layer to the first and second substrates.

16. The method of claim 1 comprising the steps of:
    preparing surfaces of one or more of the first or second recesses to receive electro-less plating; and
    electro-less plating one or more of the first or second recesses before the plating step.

17. The method of claim 1 comprising the step of electrically coupling an IC device to a plurality of the second conductive structures along the first major surface of the second substrate.

18. A method of making a multilayered, fusion bonded circuit structure comprising the steps of:
    attaching a first circuitry layer to a first major surface of a first liquid crystal polymer (LCP) substrate;
    forming a plurality of first vias extending from a second major surface of the first substrate to the first circuitry layer;
    plating the first vias;
    applying a photo sensitive material to the first circuitry layer;
    imaging the photo sensitive material to create a plurality of first recesses that expose locations on the first circuitry layer;
    plating the first recesses to form a plurality of first conductive pillars of solid metal that substantially fill the first recesses, the first conductive pillars extending above the first major surface of the first substrate;
    forming a plurality of second recesses in a second LCP substrate corresponding to the plurality of the first conductive pillars;
    plating the second recesses to form a plurality of second conductive structures that extend between first and second major surfaces of the second substrate;
    forming a plurality of through holes corresponding to the first conductive pillars and the second conductive structures in a bond layer of low melt LCP;
    positioning the bond layer between the first and second substrates with the through holes aligned with the first conductive, pillars and the second conductive structures, before the fusion bonding step; and fusion bonding the bond layer to the first and second substrates.

\* \* \* \* \*